US012796189B2

(12) United States Patent
Arihara et al.

(10) Patent No.: US 12,796,189 B2
(45) Date of Patent: Nov. 10, 2026

(54) SEALING MEMBER SHEET FOR SURFACE-EMITTING DEVICE

(71) Applicant: DAI NIPPON PRINTING CO., LTD., Tokyo-to (JP)

(72) Inventors: Keita Arihara, Tokyo-to (JP); Marii Nishikawa, Tokyo-to (JP); Atsuo Tsuzuki, Tokyo-to (JP); Yoshihiro Kanai, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 725 days.

(21) Appl. No.: 18/031,261

(22) PCT Filed: Oct. 19, 2021

(86) PCT No.: PCT/JP2021/038555
§ 371 (c)(1),
(2) Date: Apr. 11, 2023

(87) PCT Pub. No.: WO2022/085668
PCT Pub. Date: Apr. 28, 2022

(65) Prior Publication Data

US 2023/0378403 A1 Nov. 23, 2023

(30) Foreign Application Priority Data

Oct. 20, 2020 (JP) ................................ 2020-176297

(51) Int. Cl.
*H10H 20/855* (2025.01)
*H10H 20/853* (2025.01)
(Continued)

(52) U.S. Cl.
CPC ........ *H10H 20/855* (2025.01); *H10H 20/853* (2025.01); *H10H 20/854* (2025.01); *H10W 90/00* (2026.01)

(58) Field of Classification Search
CPC ............... G02F 1/1336; F21Y 2105/10; F21Y 2115/10; H10H 20/854; H10H 20/0362; B32B 27/00; B32B 27/32; B32B 27/36
(Continued)

(56) References Cited

U.S. PATENT DOCUMENTS

2003/0231394 A1 12/2003 Kimura
2009/0002817 A1* 1/2009 Harada ................ G02B 5/0242
359/453

(Continued)

FOREIGN PATENT DOCUMENTS

CN 109254451 A 1/2019
JP 2002-372605 A 12/2002
(Continued)

OTHER PUBLICATIONS

Dec. 14, 2021 International Search Report issued in International Patent Application No. PCT/JP2021/038555.
(Continued)

*Primary Examiner* — Eliseo Ramos Feliciano
*Assistant Examiner* — Mikka Liu
(74) *Attorney, Agent, or Firm* — Oliff PLC

(57) ABSTRACT

A surface-emitting device includes: a light-emitting diode substrate including a supporting substrate, and a light-emitting diode element placed on one surface side of the supporting substrate; a sealing member placed on a light-emitting diode element side surface of the light-emitting diode substrate, and configured to seal the light-emitting diode element; and a diffusion member placed on the sealing member, on an opposite surface side to the light-emitting diode substrate side, wherein a haze value of the sealing member is 4% or more, and a thickness thereof is thicker than a thickness of the light-emitting diode element.

8 Claims, 11 Drawing Sheets

(51) Int. Cl.
*H10H 20/854* (2025.01)
*H10W 90/00* (2026.01)

(58) Field of Classification Search
USPC .................................................... 257/91, 100
See application file for complete search history.

(56) References Cited

U.S. PATENT DOCUMENTS

| | | | |
|---|---|---|---|
| 2013/0224436 | A1 | 8/2013 | Kim et al. |
| 2014/0014160 | A1 | 1/2014 | Ishiguro |
| 2014/0160765 | A1 | 6/2014 | Sato et al. |
| 2017/0103972 | A1 | 4/2017 | Yamada et al. |
| 2019/0124733 | A1 | 4/2019 | Yamada |
| 2019/0326265 | A1* | 10/2019 | Ting .................... H01L 25/0753 |
| 2021/0223629 | A1 | 7/2021 | Tsuzuki et al. |
| 2021/0246338 | A1* | 8/2021 | Takarada ................. C09J 7/385 |

FOREIGN PATENT DOCUMENTS

| | | | |
|---|---|---|---|
| JP | 2003-046105 | A | 2/2003 |
| JP | 2008-200861 | A | 9/2008 |
| JP | 2010-059277 | A | 3/2010 |
| JP | 2012-078494 | A | 4/2012 |
| JP | 2013-200397 | A | 10/2013 |
| JP | 2013-200398 | A | 10/2013 |
| JP | 2014-502291 | A | 1/2014 |
| JP | 2014-148584 | A | 8/2014 |
| JP | 2016-087791 | A | 5/2016 |
| JP | 2017-073549 | A | 4/2017 |
| JP | 2018-050027 | A | 3/2018 |
| JP | 2018-127561 | A | 8/2018 |
| JP | 2019-079873 | A | 5/2019 |
| JP | 2020-105400 | A | 7/2020 |
| JP | 2021-039928 | A | 3/2021 |
| JP | 2021-138825 | A | 9/2021 |
| TW | 202111053 | A | 3/2021 |
| WO | 2012/124465 | A1 | 9/2012 |
| WO | 2013/018902 | A1 | 2/2013 |
| WO | 2019/225761 | A1 | 11/2019 |
| WO | 2022/085668 | A1 | 4/2022 |

OTHER PUBLICATIONS

Dec. 14, 2021 Written Opinion issued in International Patent Application No. PCT/JP2021/038555.

* cited by examiner

SEALING MEMBER SHEET FOR SURFACE-EMITTING DEVICE

TECHNICAL FIELD

The present disclosure relates to, for example, a surface-emitting device, a display device using the same, a sealing member sheet for a surface-emitting device, and a method for producing a surface-emitting device.

BACKGROUND ART

Recently, in the field of a display device, higher definition display has been required. The display device using light-emitting diode element has been attracting attention since it has advantages such as high luminance and high contrast, and the development thereof is in progress. Incidentally, in the following descriptions, "light-emitting diode" may be referred to as "LED" in the explanations. For example, as a backlight used for a liquid crystal display device, the development of a backlight using a LED element is in progress. The backlight is also referred to as a mini-LED backlight.

Here, the LED backlight is roughly classified into a downlight type system and an edge light type system. For a small or medium size display device such as a mobile terminal such as a smartphone, an edge light system LED backlight is usually used in many cases. However, from the viewpoint of brightness, it has been studied to use a downlight type system LED backlight. Meanwhile, in a large display device such as a large screen liquid crystal television, the downlight type system LED backlight is used in many cases.

The downlight type system LED backlight has a configuration wherein a plurality of LED elements are placed on a substrate. In such a downlight type system LED backlight, by independently controlling a plurality of LED elements, it is possible to realize so-called local dimming wherein the brightness of each area of the LED backlight is adjusted according to the brightness and darkness of display graphic. Thereby, it is possible to achieve a large improvement of contrast and low power consumption of the display device.

CITATION LIST

Patent Document

Patent Literature 1: WO2013/018902

SUMMARY OF DISCLOSURE

Technical Problem

In surface-emitting devices such as the downlight type system LED backlight, in view of suppressing a luminance unevenness, a diffusion plate or a transmission reflector (hereinafter, a diffusion member) is placed on the upper side of the LED element. In order to suppress the luminance unevenness, it is necessary to place the LED element and the diffusion member apart. Therefore, it is difficult to reduce the thickness thereof. Also, in order to maintain a predetermined gap between the LED element and the diffusion member, pins or spacers are conventionally placed (for example, Patent Document 1). FIG. 12A is a conventional LED backlight 60 wherein pins 65 are placed in order to secure distance "d" between a LED element 63 on a supporting substrate 62 and a diffusion member 66. FIG. 12B1 is a conventional LED backlight 61 wherein spacers 67 are placed between the supporting substrate 62 and the diffusion member 66, and FIG. 12B2 is a schematic plan view of the spacers 67.

As described above, when the pins or the spacers are placed, luminance unevenness occurs due to the light emitted from the LED element is blocked or reflected by the pins or the spacers, so that the in-plane uniformity of luminance is not good. In such case, in Patent Document 1, for example, there is a further need to place a diffusion plate or the like on the upper side of the transmission reflector, which makes the reducing of the module thickness more difficult. As described above, there is a problem in a conventional surface-emitting device that it is difficult to realize the improvement of the in-plane uniformity of luminance and the reduction of the thickness at the same time.

The present disclosure has been made in view of the above circumstances, and a main object thereof is to provide a surface-emitting device, a display device, and a sealing member sheet for a surface-emitting device capable of improving the in-plane uniformity of luminance, while reducing the thickness.

Solution to Problem

In order to solve the problems, the present disclosure provides a surface-emitting device comprising: a light-emitting diode substrate including a supporting substrate, and a light-emitting diode element placed on one surface side of the supporting substrate; a sealing member placed on a light-emitting diode element side surface of the light-emitting diode substrate, and configured to seal the light-emitting diode element; and a diffusion member placed on the sealing member, on an opposite surface side to the light-emitting diode substrate side, wherein a haze value of the sealing member is 4% or more, and a thickness thereof is thicker than a thickness of the light-emitting diode element.

The present disclosure provides a display device comprising a display panel; and the surface-emitting device described above placed on a rear surface of the display panel.

The present disclosure provides a sealing member sheet for a surface-emitting device used for a surface-emitting device, wherein the sealing member sheet for a surface-emitting device includes a thermoplastic resin, and a haze value measured according to the following test method is 4% or more.

(Test Method)

The sealing member sheet for a surface-emitting device is sandwiched between two ethylene tetrafluoroethylene copolymer films with a thickness of 100 μm; the sealing member sheet for a surface-emitting device is heated and pressurized at heating temperature of 150° C., vacuuming time of 5 minutes, a pressure of 100 kPa, and pressurizing time of 7 minutes; cooled to 25° C.; the two ethylene tetrafluoroethylene copolymer films were peeled off from the sealing member sheet for a surface-emitting device; and a haze of only the sealing member sheet for a surface-emitting device is measured.

The present disclosure provides a method for producing a surface-emitting device, the surface-emitting device comprising: a light-emitting diode substrate including a supporting substrate, and a light-emitting diode element placed on one surface side of the supporting substrate; a sealing member placed on a light-emitting diode element side surface of the light-emitting diode substrate, and configured to seal the light-emitting diode element; and a diffusion member placed on the sealing member, on an opposite surface side to a light-emitting diode substrate side, wherein the method comprises a step of stacking the sealing member sheet for a surface-emitting device described above on a light-emitting diode element side of the light-emitting diode substrate, and heat compression bonding by a vacuum lamination.

Advantageous Effects of Disclosure

The present disclosure is able to provide a surface-emitting device capable of improving the in-plane uniformity of luminance, while reducing the thickness.

BRIEF DESCRIPTION OF DRAWINGS

FIGS. 12A to 12B2 are schematic cross-sectional views of a conventional LED backlight.

DESCRIPTION OF EMBODIMENTS

Figure 1A:
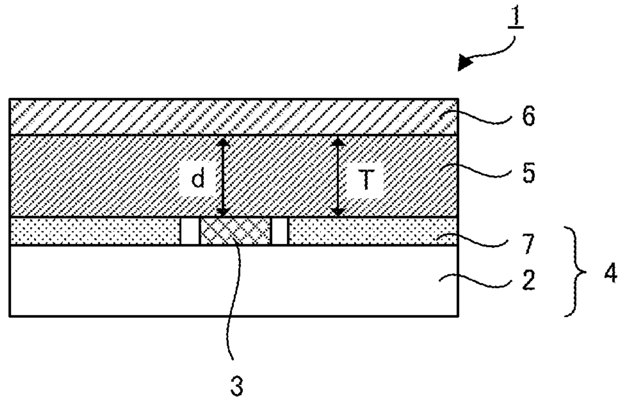
FIGS. 1A to 1C are schematic cross-sectional views illustrating an example of a surface-emitting device in the present disclosure.

The surface-emitting device, display device, and sealing member sheet for a surface-emitting device in the present disclosure are hereinafter explained. However, the present disclosure is enforceable in a variety of different aspects, and thus should not be taken as is limited to the contents described in the embodiments exemplified as below. Also, the drawings may show the features such as width, thickness, and shape of each member schematically comparing to the actual form in order to explain the present disclosure more clearly in some cases; however, it is merely an example, and thus does not limit the interpretation in the present disclosure. Also, in the present description and each drawing, for the factor same as that described in the figure already explained, the same reference sign is indicated and the detailed explanation thereof may be omitted.

In the present descriptions, in expressing an aspect wherein a certain member is placed on another member, when described as merely "on surface side", unless otherwise stated, it includes both of the following cases: a case wherein a certain member is placed directly on or directly below another member so as to be in contact with another member, and a case wherein a certain member is placed on the upper side or the lower side of another member via yet another member.

Also, in the present descriptions, terms such as "sheet", "film", and "plate" are not distinguished from each other based only on differences in designations. For example, a "sheet" is used in the mean that it includes a member referred to as a film and a plate.

As described above, there is a problem in a conventional surface-emitting device that it is difficult to realize the in-plane uniformity of luminance and the reduction of the thickness at the same time. In order to solve such problem, the inventors of the present disclosure have attempted to place a sealing member between the light-emitting diode element and the diffusion member.

When a space exists between the light-emitting diode element and the diffusion member as the conventional surface-emitting device, since the refractive index difference between the air in the space and the light-emitting diode element is large, the emitting angle of the light emitted from the light-emitting diode element may be increased by the refractive index difference. Since good light diffusion effect by the diffusion member may be obtained by this, it has been possible to obtain in-plane uniformity of luminance to an extent. However, as described above, in such embodiment, it has been difficult to make the surface-emitting device thin.

Meanwhile, when a sealing member is placed between the light-emitting diode element and the diffusion member, the refractive index difference between the light-emitting diode element and the sealing member is not as large as the refractive index difference between the light-emitting diode element and air. Therefore, the emitting angle of the light emitted from the light-emitting diode element is not sufficient. Further, in order to make the surface-emitting device thinner, the sealing member cannot be made thick. Thus, sufficient in-plane uniformity of luminance cannot be achieved by using a sealing member in a surface-emitting device.

However, as a result of intensive studies, the inventors of the present disclosure have found out that a thin surface-emitting device having good in-plane uniformity of luminance may be realized by using a sealing member with a predetermined thickness and a predetermined haze value for a surface-emitting device.

A. Surface-Emitting Device

Figure 1B:
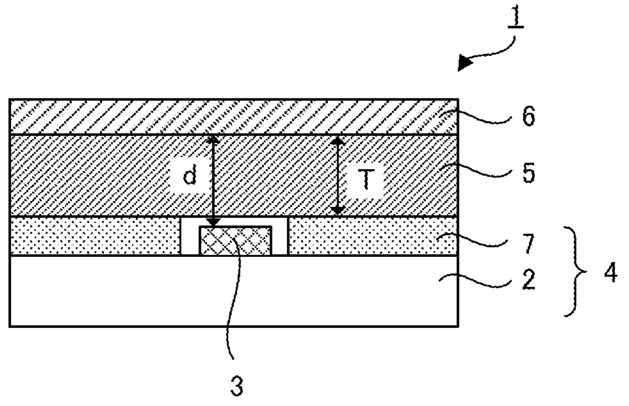
Figure 1C:
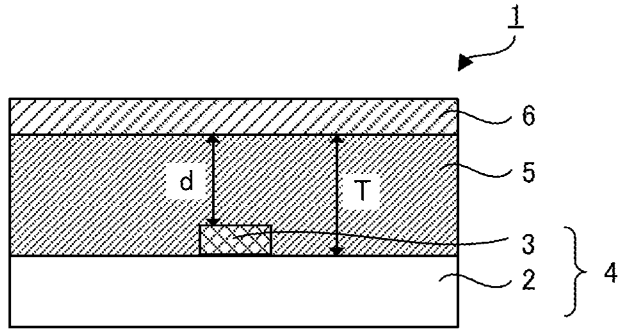

The surface-emitting device in the present disclosure will be described, referring to drawings. FIGS. 1A to 1C are schematic cross-sectional views illustrating an example of a surface-emitting device in the present disclosure. As shown in FIGS. 1A to 1C, a surface-emitting device 1 comprises a light-emitting diode substrate 4 including a supporting substrate 2, and a light-emitting diode element 3 placed on one surface side of the supporting substrate 2; a sealing member 5 placed on a light-emitting diode element 3 side surface of the light-emitting diode substrate 4, and configured to seal the light-emitting diode element 3; and a diffusion member 6 placed on the sealing member 5, on an opposite surface side to the light-emitting diode substrate 4 side. FIGS. 1A and 1B show an example of the light-emitting diode substrate 4 including a reflective layer 7. FIG. 1A shows an example wherein the light-emitting diode element 3 and the sealing member 5 are in contact. FIG. 1B shows an example wherein the light-emitting diode element 3 and the sealing member 5 are placed via a gap between thereof. FIG. 1C shows an example wherein the periphery of the light-emitting diode element 3 is covered with the sealing member 5. The haze value of the sealing member 5 in the present disclosure is 4% or more, and the thickness "T" thereof is thicker than the thickness of the light-emitting diode element.

According to the present disclosure, the haze value of the sealing member is a predetermined value or more, and the thickness thereof is thicker than the thickness of the light-emitting diode element. Therefore, distance "d" between the light-emitting diode element and the diffusion member may be a distance sufficient for light to be diffused. Also, the incident angle when the light emitted from the light-emitting diode element enters to the diffusion member may be relatively large. Therefore, the light emitted from the light-emitting diode element that enters the diffusion member may be diffused throughout the whole light emitting surface, so that the luminance unevenness may be suppressed.

Thereby, in the surface-emitting device in the present disclosure, both of the in-plane uniformity of luminance and the reduction of the thickness may be realized.

1. Sealing Member

The haze value of the sealing member in the present disclosure is 4% or more, and the thickness thereof is thicker than the thickness of the light-emitting diode element. The sealing member has a light transmissivity, and is placed on the light-emitting surface side of the light-emitting diode substrate.

(1) Haze Value

The haze value of the sealing member in the present disclosure is 4% or more, may be 6% or more, preferably 8% or more, and further preferably 10% or more. When the haze value is lower than the above value, luminance unevenness may not be suppressed. Meanwhile, although the upper limit is not particularly limited, and is, for example, 85% or less, preferably 60% or less, and further preferably 30% or less. In the present descriptions, the haze value is a value as a whole sealing member, and may be measured by cutting out the sealing member from the surface-emitting device, and by a method according to JIS K7136, with a haze meter (HM-150 from Murakami Color Research Laboratory Co., Ltd.).

A method for adjusting the haze value to obtain the haze value described above is not particularly limited, and examples thereof may include a method of utilizing the difference in crystallinity degree of the resins, and a method of varying the fine particle content in the resins. Among the above, a method of adjusting the crystallinity degree of the resins is preferable. When the haze value is increased by increasing the crystallinity degree of the resin, an effect of decreasing straight advancing transmitting light may be obtained. The crystallinity degree of the resin may be adjusted by selecting the type of the base resin included in the sealing member described later. Also, it may be adjusted by the cooling conditions after heat compression bonding of the sealing member sheet to the light-emitting diode substrate.

(2) Thickness

The thickness of the sealing member in the present disclosure may be any thickness thicker than the light-emitting diode element. Specifically, the thickness is preferably, for example, 50 μm or more, more preferably 80 μm or more, and further preferably 200 μm or more. Meanwhile, the thickness of the sealing member is, for example, 800 μm or less, preferably 750 μm or less, and further preferably 700 μm or less.

Incidentally, the "thickness" in the present descriptions may be measured using a known measurement method capable of measuring a μ-order size. For example, the thickness may be measured by preparing a cross-section sample of the sealing member, and using an observation image of the cross-section by an optical microscope or a scanning electron microscope (SEM). Also, a contact type film thickness measuring device (such as Thickness Gage 547-301 from Mitutoyo Corporation) may be used. The same applies to the measurement of the dimension such as "size".

When the thickness is thinner than the above range, the thickness is not sufficient so that the light emitted from the light-emitting diode element cannot be diffused throughout the whole light emitting surface, and the in-plane uniformity of luminance may not be improved. Also, when the thickness is thicker than the above range, the reduction in thickness may not be realized.

Also, as shown in FIGS. 1A to 1C, the thickness of the sealing member "T" may be the same as the distance "d" between the light-emitting diode element 3 and the diffusion member 6 (FIG. 1A), the thickness of the sealing member "T" may be less than the distance "d" between the light-emitting diode element 3 and the diffusion member 6 (FIG. 1B), and the thickness of the sealing member "T" may be more than the distance "d" between the light-emitting diode element 3 and the diffusion member 6 (FIG. 1C).

(3) Material of Sealing Member

The material included in the sealing member in the present disclosure is not particularly limited as long as it is material capable of realizing the haze value described above, and a thermoplastic resin is preferable. By using the thermoplastic resin, for example, the haze value may be adjusted to be high compared to a case wherein a thermosetting resin is used, and further, the sealing member may be formed at low temperature.

Figure 2A:
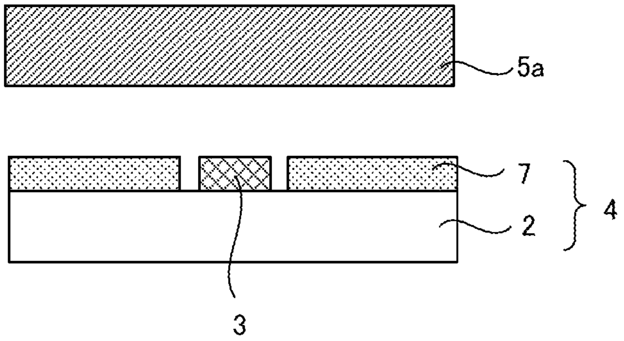
FIGS. 2A and 2B are process diagrams illustrating an example of a method for forming a sealing member in the present disclosure.
Figure 2B:
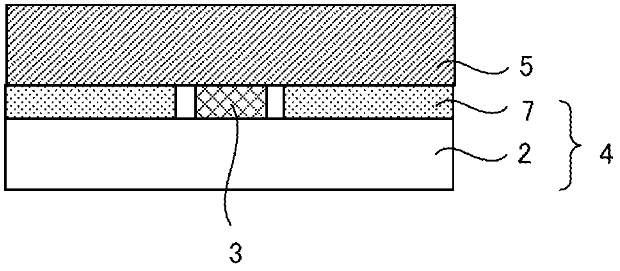

Also, when the sealing member includes a thermoplastic resin, a sheet shaped sealing member (hereinafter, it may be referred to as a sealing member sheet in some cases) including a sealing material composition containing a thermoplastic resin, may be used. FIGS. 2A and 2B are process diagrams illustrating an example of a method for forming a sealing member in the present disclosure. For example, as shown in FIG. 2A, the light-emitting diode substrate 4 and a sealing member sheet 5*a* are prepared. As shown in FIG. 2B, the sealing member 5 may be formed by stacking the sealing member sheet 5*a* on the light-emitting diode element 3 side surface of the light-emitting diode substrate 4, and then, compression bonding the sealing member sheet 5*a* to the light-emitting diode substrate 4 using, for example, a vacuum lamination method.

Meanwhile, when the sealing member includes a curable resin such as a thermosetting resin and a photocurable resin, a liquid sealing material is usually used. When the liquid sealing material is used, a phenomenon wherein the thickness of the edge portion becomes thicker or thinner compared to the center portion, in relation to surface tension, for example, may occur. Also, in the case of a curable resin, shrinkage, for example, of the volume at the time of curing tends to occur, and as a result, the thickness of the center portion and the edge portion of the cured sealing member may become uneven. When the thickness of the sealing member is uneven as described above, luminance unevenness may occur.

Meanwhile, when the sheet shaped sealing material is used, it is possible to avoid the occurrence of the surface unevenness of the sealing member such as the occurrence of the thickness distribution of the coating film due to the surface tension; and the occurrence of the thickness distribution due to the thermal shrinkage or the optical shrinkage, which occurs when the liquid sealing material is used. Therefore, it is possible to obtain a sealing member with good flatness, so that a higher quality display device may be provided.

(a) Thermoplastic Resin

In the present disclosure, for example, an olefin based resin, a vinyl acetate (EVA), and a polyvinyl butyral based resin may be used as the thermoplastic resin.

Among the above, the thermoplastic resin is preferably an olefin based resin. This is because the olefin based resin particularly rarely generates a component which deteriorates the light-emitting diode substrate, and the melt viscosity is also low, so that the light-emitting diode element described above may be well sealed. Also, among the olefin based resin, a polyethylene based resin, a polypropylene based resin, and an ionomer based resin are preferable.

Here, the polyethylene based resin in the present descriptions includes not only ordinary polyethylene obtained by polymerizing ethylene, but also a resin obtained by polymerizing a compound having an ethylenically unsaturated bond such as a α-olefin; a resin obtained by copolymerizing a plurality of different compounds having an ethylenically unsaturated bond; and a modified resin obtained by grafting another chemical species to these resins.

Particularly, in view of obtaining the haze value described above, the sealing member in the present disclosure preferably includes a polyethylene based resin with a density of 0.870 $g/cm^3$ or more and 0.930 $g/cm^3$ or less as a base resin. Particularly, the sealing member preferably includes a polyethylene based resin with a density of 0.890 $g/cm^3$ or more and 0.930 $g/cm^3$ or less as a base resin. When the sealing member is a multi-layer member as will be described later, the polyethylene based resin with the density described above is preferably used as a base resin of the core layer.

For the sealing member in the present disclosure, a silane copolymer obtained by copolymerizing an α-olefin and an ethylenically unsaturated silane compound as comonomers (hereinafter, also referred to as "silane copolymer") may be preferably used. By using such resins, it is possible to obtain higher adhesiveness between the light-emitting diode substrate and the sealing member. As the above silane copolymer, those described in Japanese Patent Application Laid-Open (JP-A) No. 2018-50027 may be used.

(b) Melting Point

The melting point of the thermoplastic resin used in the present disclosure is not particularly limited as long as it is able to seal the light-emitting diode element, and is preferably, for example, 90° C. or more and 135° C. or less. Among the above, the thermoplastic resin is preferably not softened by the heat generated during the light emission of the light-emitting diode, and it is preferable to use the thermoplastic resin with a melting point of 90° C. or more and 120° C. or less.

Incidentally, the melting point of the thermoplastic resins may be measured, for example, by differential scanning calorimetry (DSC) in accordance with the plastic transition temperature measuring method (JISK7121). When a plurality of types of the thermoplastic resin are included, the highest melting point value is employed. When the sealing member is a multi-layer member as will be described later, the thermoplastic resin with the melting point described above is preferably used as a base resin of the core layer.

(c) Melt Mass Flow Rate (MFR)

Also, as the thermoplastic resin in the present disclosure, those having melt viscosities capable of following and entering into the gap of the unevenness of the light-emitting diode element and other members placed on one surface side of the light-emitting diode substrate by being heated, are suitably used.

Specifically, the melt mass flow rate (MFR) of the thermoplastic resin to be used is preferably 0.5 g/10 min or more and 40 g/10 min or less, and more preferably 2.0 g/10 min or more and 40 g/10 min or less. By MFR being in the range described above, it is possible to enter into the gap of the light-emitting diode element or the like. Therefore, a sufficient sealing performance may be exhibited, and further, a sealing member excellent in adhesion to the light-emitting diode substrate may be obtained.

Incidentally, the MFR in the present descriptions refers to a value measured according to JIS K7210 at 190° C. and load of 2.16 kg. However, the MFR of the polypropylene resin refers to a value of the MFR, similarly measured according to JIS K7210 at 230° C. and load of 2.16 kg.

For the MFR when the sealing member is a multi-layer member as will be described later, the measured value obtained by carrying out a measurement in a multi-layer condition wherein all the layers are stacked as one, according to the measurement method described above is regarded as the MFR value of the multi-layer sealing member.

(d) Elastic Modulus

Also, as for the thermoplastic resin in the present disclosure, the elastic modulus at room temperature (25° C.) is preferably $5.0 \times 10^7$ Pa or more and $1.0 \times 10^9$ Pa or less. Sufficient adhesion to the light-emitting diode substrate may be exhibited, and for example, when an impact is applied to the surface-emitting device from outside, the sealing member is excellent in impact resistance. When the sealing member is a multi-layer member as will be described later, the thermoplastic resin with the elastic modulus described above is preferably used as a base resin of the core layer.

(e) Refractive Index

The refractive index of the thermoplastic resin in the present disclosure is preferably 1.41 or more and 1.58 or less. When the refractive index is the above value or more, a light confining function is sufficient, the in-plane uniformity of luminance improving effect due to the use of a sealing member with a high haze, is improved. When the refractive index is the above value or less, there is no risk of light being confined too much within the sealing member, so that the light may be emitted outside, and a high luminance may be obtained.

Also, when the sealing member in the present disclosure is a resin layer wherein diffusion agent (fine particles) is dispersed, the refractive index difference between the resin component (such as thermoplastic resin) of the resin layer and the fine particles is preferably 0.04 or more and 1.3 or less. When the refractive index difference is the above value or more, the sealing member exhibits a sufficient diffusion performance, so that the effect of the in-plane uniformity of luminance is improved. Also, when the refractive index difference is less than the above value, the backward scattering is strong, so that the in-plane uniformity of luminance improving effect due to the use of a sealing member with a high haze is decreased.

In addition to the thermoplastic resin, an additive such as an antioxidant and a light stabilizer may be added to the sealing member.

(4) Structure of Sealing Member

Figure 3A:
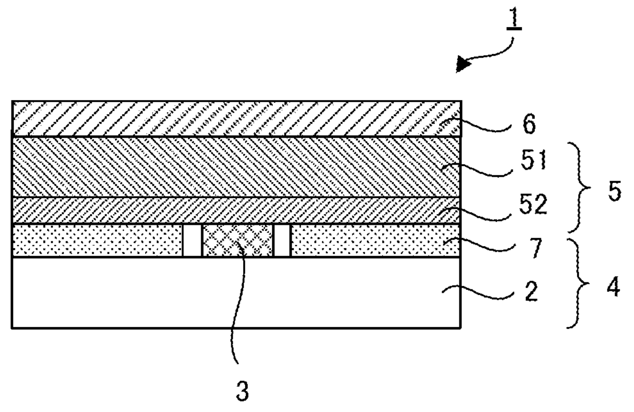
FIGS. 3A and 3B are schematic cross-sectional views illustrating an example of the structure of the sealing member of a surface-emitting device in the present disclosure.
Figure 3B:
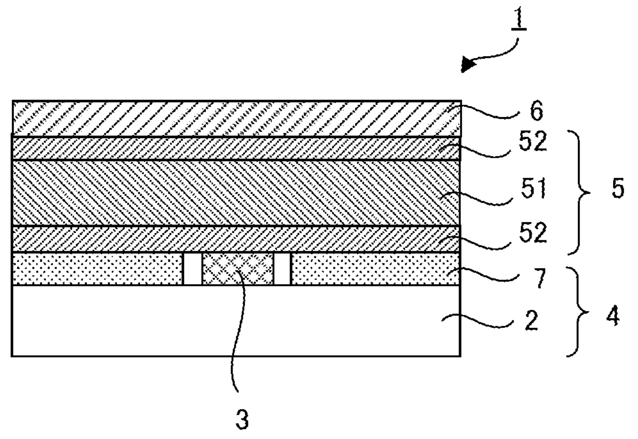

As for the sealing member in the surface-emitting device in the present disclosure, as shown in FIGS. 1A to 1C for example, the sealing member 5 may be a single layer member including a single resin layer, and as shown in FIGS. 3A and 3B, the sealing member 5 may be a multi-layer member wherein a plurality of resin layers (two layers in FIG. 3A, and three layers in FIG. 3B), including a core layer 51, and a skin layer 52 placed on at least one surface of the core layer 51, are stacked. Particularly, the sealing member 5 has preferably a two-layer structure including the core layer, and the skin layer placed on the light-emitting diode substrate side of the core layer.

When the sealing member in the present disclosure is the multi-layer member of the two-layer structure including the core layer, and the skin layer placed on the light-emitting diode substrate side of the core layer, the thickness ratio of the skin layer and the core layer (skin layer:core layer) is preferably 1:0.1 to 1:10, and particularly preferably 1:0.5 to 1:6.

Also, when the sealing member in the present disclosure is the multi-layer member of the three-layer structure, the thickness ratio of the skin layer and the core layer (skin layer:core layer: skin layer) is preferably 1:1:1 to 1:10:1, and particularly preferably 1:2:1 to 1:8:1.

When the sealing member in the present disclosure is the multi-layer member, the core layer and the skin layer preferably include the thermoplastic resin with different density range, melting point, or the like as base resins. The reason therefor is to easily secure the haze value in the core layer, while securing an adhesion to the light-emitting diode substrate or a molding property in the skin layer.

In the case of the multi-layer member, usually expensive material with good adhesion property and molding property capable of entering into the gap of the light-emitting diode element and the like, may be used for the skin layer placed on the light-emitting diode substrate side in the multi-layer member. In the multi-layer member, the material included in the skin layer placed on the light-emitting diode substrate side is not particularly limited as long as it has a high adhesion property and a high molding property. When the skin layer includes the thermoplastic resin, for example, the silane copolymer described above is preferably compounded. Also, as for the thermoplastic resin, the material preferably includes the olefin based resin and silane coupling agent. Incidentally, an additive such as an antioxidant and a light stabilizer may be added to this layer.

(5) Preferable Sealing Member

The sealing member in the present disclosure is preferably a multi-layer member including a plurality of layers including the core layer and the skin layer placed on at least one outermost surface. The core layer preferably includes a polyethylene based resin with a density of 0.900 g/cm$^3$ or more and 0.930 g/cm$^3$ or less as a base resin; and the skin layer preferably includes a polyethylene based resin with a density of 0.875 g/cm$^3$ or more and 0.910 g/cm$^3$ or less as a base resin, which is lower than the density of the base resin for the core layer.

As the base resin for the core layer, a low-density polyethylene based resin (LDPE), a linear low-density polyethylene based resin (LLDPE), or a metallocene based linear low-density polyethylene based resin (M-LLDPE) may be preferably used. Among them, from the viewpoint of long-term reliability, a low-density polyethylene based resin (LDPE) may be particularly preferably used as a base resin for the core layer.

The density of the polyethylene based resin used as the base resin for the core layer is 0.900 g/cm$^3$ or more and 0.930 g/cm$^3$ or less, and more preferably 0.920 g/cm$^3$ or less. By setting the density of the base resin for the core layer in the above range, the haze value of the sealing member in the present disclosure may be a predetermined value or more. Also, it is possible to provide sufficient heat resistance required for the sealing member without undergoing a crosslinking treatment.

The melting point of the polyethylene based resin used as the base resin for the core layer is preferably 90° C. or more and 135° C. or less, more preferably 90° C. or more and 120° C. or less, and further preferably 90° C. or more and 115° C. or less. By setting the melting point in the above range, the heat resistance and the molding property of the sealing member may be maintained in a preferable range. Incidentally, by adding a resin with a high melting point such as polypropylene to the sealing material composition for the core layer, it is possible to increase the melting point of the sealing member to approximately 165° C. In this case, 5% by mass or more and 40% by mass or less of the polypropylene is preferably included, with respect to the total resin components of the core layer.

The polypropylene to be included in the core layer is preferably a homopolypropylene (homoPP) resin. Since the homoPP is a polymer including only polypropylene monomers and has high crystallinity, it has even higher rigidity compared with block PP or random PP. By using this as an additive resin to the sealing material composition for the core layer, the dimensional stability of the sealing member may be increased. Also, the MFR measured according to JIS K7210 at 230° C. and at a load of 2.16 kg, of the homoPP used as an additive resin to the sealing material composition for the core layer, is preferably 5 g/10 min or more and 125 g/10 min or less. When the MFR is too low, the molecular weight is increased so that the rigidity is too high, and the preferable sufficient flexibility of the sealing material composition is hardly ensured. Also, when the MFR is too high, the fluidity at the time of heating may not be sufficiently suppressed, and the heat resistance and dimensional stability may not be sufficiently imparted to the sealing member sheet.

The melt mass flow rate (MFR) of the polyethylene based resin used as the base resin for the core layer is preferably 1.0 g/10 min or more and 7.5 g/10 min or less, and more preferably 1.5 g/10 min or more and 6.0 g/10 min or less, at 190° C., and at a load of 2.16 kg. By setting the MFR of the base resin for the core layer in the above range, the heat resistance and the molding property of the sealing member may be maintained in a preferable range. Also, the processability at the time of film formation may be sufficiently enhanced to contribute to the improvement of the productivity of the sealing member.

The content of the base resin with respect to the total resin components in the core layer is 70% by mass or more and 99% by mass or less, and preferably 90% by mass or more and 99% by mass or less. As long as the sealing member includes the base resin in the above range, other resins may be included.

As the base resin for the skin layer of the sealing member, a low-density polyethylene based resin (LDPE), a linear low-density polyethylene based resin (LLDPE), or a metallocene based linear low-density polyethylene based resin (M-LLDPE) may be preferably used, similar to the sealing material composition for the core layer. Among them, from the viewpoint of the molding property, a metallocene based linear low-density polyethylene based resin (M-LLDPE) may be particularly preferably used as the sealing material composition for the skin layer.

The density of the polyethylene based resin used as the base resin for the skin layer is 0.875 g/cm$^3$ or more and 0.910 g/cm$^3$ or less, and more preferably 0.899 g/cm$^3$ or less. By setting the density of the base resin for the skin layer in the above range, the adhesiveness of the sealing member may be maintained in a preferable range.

The melting point of the polyethylene based resin used as the base resin for the skin layer is preferably 50° C. or more and 100° C. or less, and more preferably 55° C. or more and 95° C. or less. By setting the melting point in the above range, the adhesiveness of the sealing member may further be improved for sure.

The melt mass flow rate (MFR) of the polyethylene based resin used as the base resin for the skin layer is preferably 1.0 g/10 min or more and 7.0 g/10 min or less, and more preferably 1.5 g/10 min or more and 6.0 g/10 min or less, at 190° C., and at a load of 2.16 kg. By setting the MFR of the base resin for the skin layer in the above range, the adhesiveness of the sealing member may be maintained in a further preferable range. Also, the processability at the time of film formation may be sufficiently enhanced to contribute to the improvement of the productivity of the sealing member.

The content of the base resin with respect to the total resin components in the skin layer is 60% by mass or more and 99% by mass or less, and preferably 90% by mass or more and 99% by mass or less. As long as the sealing member includes the base resin in the above range, other resins may be included.

In all of the sealing material compositions described above, it is more preferable that a silane copolymer obtained by copolymerizing an α-olefin and an ethylenically unsaturated silane compound as comonomers, is included in each of the sealing material compositions in a constant amount, if necessary. Since degree of freedom, of a silanol group contributing to an adhesive force, of such graft copolymer is high, adhesiveness of the sealing member to other members may be improved.

Examples of the silane copolymer may include a silane copolymer described in JP-A No. 2003-46105. By using the silane copolymer as a component of the sealing material composition, a sealing member having the following properties may be obtained stably at low cost: excellent in strength, and durability, for example; excellent in weather resistance, heat resistance, water resistance, light resistance, and various other characteristics; and further, exhibits outstanding heat fusion property, not being affected by production conditions such as heat compression bonding at the time of placing the sealing member.

As the silane copolymer, any one of a random copolymer, an alternating copolymer, a block copolymer, and a graft copolymer may be preferably used, and a graft copolymer is more preferable, and a graft copolymer obtained by polymerizing a polyethylene for polymerization as a main chain, and an ethylenically unsaturated silane compound as a side chain is further preferable. Since degree of freedom of a silanol group contributing to an adhesive force, of such graft copolymer, is high, adhesiveness of the sealing member may be improved.

The content of an ethylenically unsaturated silane compound constituting the copolymer of an α-olefin and an ethylenically unsaturated silane compound is, for example, 0.001% by mass or more and 15% by mass or less, preferably 0.01% by mass or more and 10% by mass or less, and particularly preferably 0.05% by mass or more and 5% by mass or less, with respect to the total copolymer mass. Although the mechanical strength, and the heat resistance, for example, are good when the content of the ethylenically unsaturated silane compound constituting the copolymer of the α-olefin and the ethylenically unsaturated silane compound is high, the tensile elongation, and heat fusibility, for example, tend to be low, when the content thereof is too much.

The content of the silane copolymer with respect to the total resin components of the sealing material composition is preferably 2% by mass or more and 20% by mass or less in the sealing material composition for the core layer, and 5% by mass or more and 40% by mass or less in the sealing material composition for the skin layer. In particular, it is more preferable that 10% by mass or more of the silane copolymer is included in the sealing material composition for the skin layer. Incidentally, the silane modification amount in the silane copolymer is preferably approximately 1.0% by mass or more and 5.0% by mass or less. The content range of the preferable silane copolymer in the sealing material composition described above assumes that the silane modification amount is in this range, and it is desirable to appropriately adjust finely according to the variation of this modification amount.

An additive such as an antioxidant and a light stabilizer may be added to all of the layers of the sealing member. Also, an adhesion improving agent may be added as appropriate. By adding the adhesion improving agent, the adhesiveness durability with other members may be enhanced. As the adhesion improving agent, a known silane coupling agent may be used. For example, a silane coupling agent including an epoxy group or a silane coupling agent including a mercapto group may be particularly preferably used.

(6) Other Sealing Member

Figure 13:
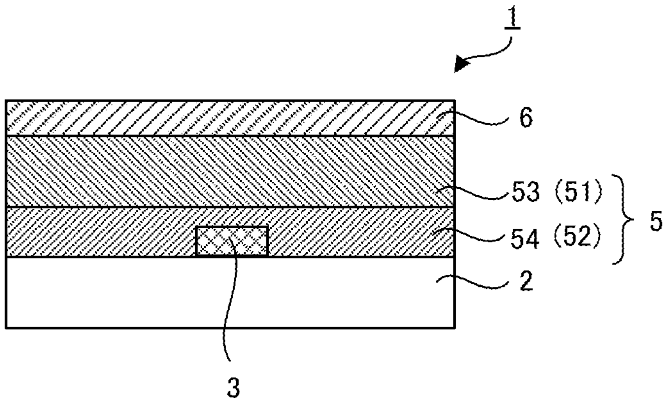
FIG. 13 is a schematic cross-sectional view illustrating an example of a surface-emitting device in the present disclosure.

When the sealing member in the present disclosure is the multi-layer member including a plurality of layers, examples of the skin layer placed on the light-emitting diode substrate side may include a pressure-sensitive adhesive layer. In this case, as shown in FIG. 13, the sealing member 5 includes the skin layer 52 which is a pressure-sensitive adhesive layer 54, and the core layer 51 which is a sealing layer 53. The type of the pressure-sensitive adhesive included in the pressure-sensitive adhesive layer may be any one of, for example, an acryl based pressure-sensitive adhesive, a polyester based pressure-sensitive adhesive, a polyurethane based pressure-sensitive adhesive, a rubber based pressure-sensitive adhesive, and a silicone based pressure-sensitive adhesive.

Further, the pressure-sensitive adhesive layer preferably includes a diffusion agent. The reason therefor is to improve the haze value. As the diffusion agent, ones similar to those described in "3. Diffusion member, 3.1 First diffusion member" below may be used.

When the multi-layer member includes the pressure-sensitive adhesive layer as described above, the haze of the sealing member is, for example 4% or more, and preferably 10% or more. The total light transmittance of the sealing member is, for example 70% or more, and preferably 80% or more.

When the sealing member is a multi-layer member including the pressure-sensitive adhesive layer, when producing the surface-emitting device, the sealing member sheet and the light-emitting diode substrate may be adhered at ordinary temperature. Therefore, a step of heat compression bonding is not necessary, so that a warpage or the like due to the difference of the linear coefficient expansion of the sealing member and the light-emitting diode substrate may be suppressed.

(6) Total Light Transmittance

The total light transmittance of the sealing member in the present disclosure is not particularly limited as long as it is able to function as a surface-emitting device, and is preferably 70% or more, and more preferably 80% or more. Incidentally, the total light transmittance of the sealing member may be measured by, for example, a method according to JIS K7361-1:1997.

(7) Method for Forming Sealing Member

As described above, the sealing member in the present disclosure may be formed using a sealing member sheet including a sealing material composition including the thermoplastic resin and other components.

The sealing member sheet is obtained by subjecting a shape forming process by a conventionally known method to the sealing material composition to form into a sheet-shape.

When the sealing member is a multi-layer member, as shown in FIG. 3A for example, a sealing member 5 with a two-layer structure of the core layer 51, and the skin layer 52 may be produced by forming a multi-layer film of a two-layer structure including a core layer and a skin layer placed on one surface of the core layer, with each sealing material composition for a core layer and for a skin layer in a predetermined thickness. Alternatively, as shown in FIG. 3B for example, a sealing member 5 with a three-layer structure of the skin layer 52, the core layer 51, and the skin layer 52 may be produced by forming a multi-layer film of a three-layer structure including the skin layers placed on both surfaces of the core layer.

2. Light-Emitting Diode Substrate

The light-emitting diode substrate in the present disclosure is a member wherein a plurality of light-emitting diode elements are placed on one surface side of the supporting substrate.

(1) Light-Emitting Diode Element

The light-emitting diode element is a member placed on one surface side of the supporting substrate, and functions as a light source.

The light-emitting diode element is not particularly limited as long as it may irradiate white light when used for, for example, a surface-emitting device, and examples thereof may include a light-emitting diode element capable of emitting, for example, white color, blue color, ultraviolet ray, or infrared ray.

The light-emitting diode element (LED element) may be a chip shaped LED element. The form of the LED element may be, for example, a light-emitting portion (also referred to as a LED chip.) itself; and may be a packaged LED (also referred to as a chip LED) such as a surface mounted type and a chip-on-board type. The package LED may include, for example, a light-emitting portion, and a protective portion including a resin and covering the light-emitting portion. Specifically, when the LED element is the light-emitting portion itself, for example, a blue LED element, an ultraviolet LED element, and an infrared LED element may be used as the LED element. Also, when the LED element is a packaged LED, a white LED element, for example, may be used as the LED element.

When the surface-emitting device in the present disclosure is intended to irradiate white color by combining the LED element and the wavelength conversion member, the LED element is preferably a blue LED element, an ultraviolet LED element, or an infrared LED element. As for the blue LED element, a white light may be produced, for example, by combining with a yellow fluorescent substance; or by combining with a red fluorescent substance and a green fluorescent substance. Also, the ultraviolet LED element may produce a white light, for example by combining with a red fluorescent substance, a green fluorescent substance, and a blue fluorescent substance. Among the above, the LED element is preferably the blue LED element. The reason therefor is to irradiate a high luminance white light in the surface-emitting device in the present disclosure.

Also, when the LED element is a white LED element, the white LED element is appropriately selected according to the light emission method, for example of the white LED element. Examples of the light-emission method of the white LED element may include a combination of a red LED, a green LED, and a blue LED; a combination of a blue LED, a red fluorescent substance, and a green fluorescent substance; a combination of a blue LED and a yellow fluorescent substance; a combination of an ultraviolet LED, a red fluorescent substance, a green fluorescent substance, and a blue fluorescent substance. Therefore, the white LED element may include, for example, a red LED light-emitting portion, a green LED light-emitting portion, and a blue LED light-emitting portion; may include a blue LED light-emitting portion, a protective portion including a red fluorescent substance and a green fluorescent substance; may include a blue LED light-emitting portion, and a protective portion including a yellow fluorescent substance; and may include an ultraviolet LED light-emitting portion, and a protective portion including a red fluorescent substance, a green fluorescent substance, and a blue fluorescent substance. Among these, the white LED element preferably includes a blue LED light-emitting portion, and a protective portion including a red fluorescent substance and a green fluorescent substance; a blue LED light-emitting portion, and a protective portion including a yellow fluorescent substance; or an ultraviolet LED light-emitting portion and a protective portion including a red fluorescent substance, a green fluorescent substance, and a blue fluorescent substance. Among the above, the white LED element preferably includes a blue LED light-emitting portion, and a protective portion including a red fluorescent substance and a green fluorescent substance; or a blue LED light-emitting portion, and a protective portion including a yellow fluorescent substance. The reason therefor is to be enable to irradiate a high luminance white light, in the surface-emitting device in the present disclosure.

The structure of the light-emitting diode element may be similar to that of a common light-emitting diode element.

The light-emitting diode element is usually placed on one surface side of the supporting substrate at an equal interval. The arrangement of the light-emitting diode element is appropriately selected according to the use and size of the surface-emitting device in the present disclosure, and the size of the light-emitting diode element, for example. Also, the arrangement density of the LED element is also appropriately selected according to the use and size of the surface-emitting device in the present disclosure, and the size of light-emitting diode element, for example.

The size (chip size) of the light-emitting diode element may be a common chip size. Among the above, the size of the LED element is preferably a chip size called a mini-LED. The size of the light-emitting diode element may be, for example, several hundreds of micrometers square, and may be several tens of micrometers square. Specifically, the size of the light-emitting diode element may be 100 μm square or more and 2000 μm square or less. When the size of the light-emitting diode element is small, the light-emitting diode element may be placed at high density, that is, the interval (pitch) between the light-emitting diode elements may be reduced, so that the distance between the light-emitting diode substrate and diffusion member may be shortened. That is, the thickness of the sealing member may be reduced. Thereby, reduction of the thickness and reduction of the weight may be realized.

(2) Supporting Substrate

The supporting substrate in the present disclosure is a member configured to support, for example, the light-emitting diode element, the sealing member, and the diffusion member described above.

The supporting substrate may be transparent, and may be opaque. Also, the supporting substrate may be flexible, and may be rigid. The material of the supporting substrate may be an organic material, may be an inorganic material, and may be a composite material obtained by compounding both of an organic material and an inorganic material.

When the material of the supporting substrate is an organic material, a resin substrate may be used as the supporting substrate. Meanwhile, when the material of the supporting substrate is an inorganic material, a ceramic substrate, and a glass substrate may be used as the supporting substrate. Also, when the material of the supporting substrate is a composite material, a glass-epoxy substrate may be used as the supporting substrate. Also, for example, a metal core substrate may also be used as the supporting substrate. A printed circuit substrate on which a circuit is formed by printing, may also be used as the supporting substrate.

The thickness of the supporting substrate is not particularly limited, and is appropriately selected according to the presence or absence of the flexibility or rigidity, and the use and size, for example, of the surface-emitting device in the present disclosure.

(3) Others

The light-emitting diode substrate in the present disclosure is not particularly limited as long as the light-emitting diode substrate includes the supporting substrate and the light-emitting diode element described above, and may have a required configuration as appropriate. Examples of such configuration may include a wiring portion, a terminal portion, an insulating layer, reflective layer, and a heat radiating member.

Each configuration may be similar to those used for a known light-emitting diode substrate.

The wiring portion is electrically connected to the light-emitting diode element. The wiring portion is usually placed in a pattern form. Also, the wiring portion may be placed on the supporting substrate via an adhesive layer. As a material of the wiring portion, for example, a metal material, and a conductive polymer material may be used.

The wiring portion is electrically connected to the light-emitting diode element by a joining portion. As a material of the joining portion, for example, a joining agent including a conductive material such as a metal and a conductive polymer, and a solder may be used.

The reflective layer may be placed on the surface of the supporting substrate on which the light-emitting diode element is placed, in a region other than the light-emitting diode element mounting region. For example, the light reflected by the second layer of the diffusion member described later may be reflected by the reflective layer of the supporting substrate, and may be entered again into the first layer of the diffusion member, to increase the utilization efficiency of the light.

The reflective layer may be similar to a reflective layer commonly used for a light-emitting diode substrate. Specifically, examples of the reflective layer may include a white resin film including metal particles, inorganic particles or pigments, and a resin; a metal film; and a porous film. The thickness of the reflective layer is not particularly limited as long as a desired reflectance may be obtained, and is appropriately set.

The method for forming the light-emitting diode substrate may be similar to a known method for forming.

3. Diffusion Member

The diffusion member is placed on the sealing member, on the opposite surface side to the light-emitting diode substrate side. The diffusion member is not particularly limited as long as it is a member having a function to diffuse the light emitted from the LED element, and emitting evenly in the surface direction, and examples thereof may include the following first diffusion member, second diffusion member, and third diffusion member.

3.1 First Diffusion Member

The first diffusion member usually includes a resin layer wherein at least a diffusion agent is dispersed. The diffusion member may be, for example a resin sheet including a diffusion agent dispersed therein, may be a stacked body including a resin layer including a diffusion agent dispersed therein, on a transparent substrate, and the former is more preferable. A resin included in the resin layer is not particularly limited as long as the diffusion agent may be dispersed, and is preferably a thermoplastic resin. Since the diffusion member may be formed using a resin sheet including a diffusion agent dispersed therein, good flatness may be obtained.

The thermoplastic resin used for the diffusion member is not particularly limited as long as it has high light transmittivity, and ones commonly used in the field of display device may be used.

The material of the diffusion agent is not particularly limited as long as it is capable of diffusing the light from the LED element, and for example, it may be an organic material, and it may be an inorganic material. When the material of the diffusion agent is an organic material, examples thereof may include polymethylmethacrylate (PMMA). Meanwhile, when the material of the diffusion agent is an inorganic material, examples thereof may include $TiO_2$, $SiO_2$, $Al_2O_3$, and silicon.

The refractive index of the diffusion agent is not particularly limited as long as it is capable of diffusing the light from LED element, and is, for example, 1.4 or more and 2 or less. Such refractive index may be measured by an Abbe refractometer, a Becke method, a minimum deviation method, an argument analysis, a mode/line method, an ellipsometry method. Examples of the shape of the diffusion agent may include a granular shape. The average particle size of the diffusion agent is, for example, 1 μm or more and 100 μm or less.

The ratio of the diffusion agent in the diffusion member is not particularly limited as long as it is capable of diffusing the light from the LED element, and is, for example, 40% by mass or more and 60% by mass or less.

3.2 Second Diffusion Member

The second diffusion member is a member including a first layer and a second layer, in this order from the LED substrate side, wherein the first layer has a light transmissivity and a light diffusivity; in the second layer, a reflectance of light increases as an absolute value of an incident angle with respect to a first layer side surface of the second layer decreases, and a transmittance of light increases as an absolute value of an incident angle with respect to a first layer side surface of the second layer increases. In the present disclosure, by including the diffusion member described above, it is possible to further improve the in-plane uniformity of luminance, while realizing the reduction of the thickness. Also, it is also possible to reduce the cost and power consumption.

Figure 4:
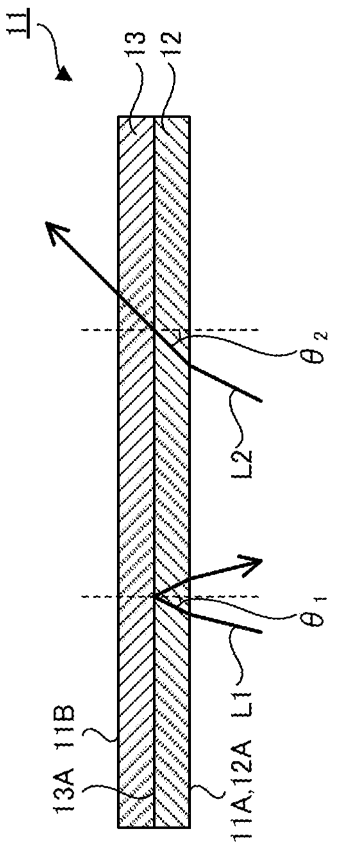
FIG. 4 is a schematic cross-sectional view illustrating an example of a second diffusion member.

The second diffusion member will be hereinafter explained with reference to drawings. FIG. 4 is a schematic cross-sectional view illustrating an example of the second diffusion member. As shown in FIG. 4, a diffusion member 11 includes a first layer 12 and a second layer 13 in this order. The first layer 12 has light transmissivity and light diffusivity, and transmits and diffuses incident lights L1 and L2 from the opposite surface 12A to the second layer 13 side surface of the first layer 12. Also, in the second layer 13, a reflectance of light increases as an absolute value of the incident angle with respect to the first layer 12 side surface 13A of the second layer 13 decreases, and a transmittance of light increases as an absolute value of the incident angle with respect to the first layer 12 side surface 13A of the second layer 13 increases. Therefore, in the second layer 13, it is possible to reflect incident light L1 with low incident angle θ1 with respect to the first layer 12 side surface 13A of the second layer 13, and to transmit incident light L2 with high incident angle θ2 with respect to the first layer 2 side surface 13A of the second layer 13. Incidentally, the low incident angle refers to one whose absolute value of the incident angle is small, and the high incident angle refers to one whose absolute value of the incident angle is large.

Figure 5:
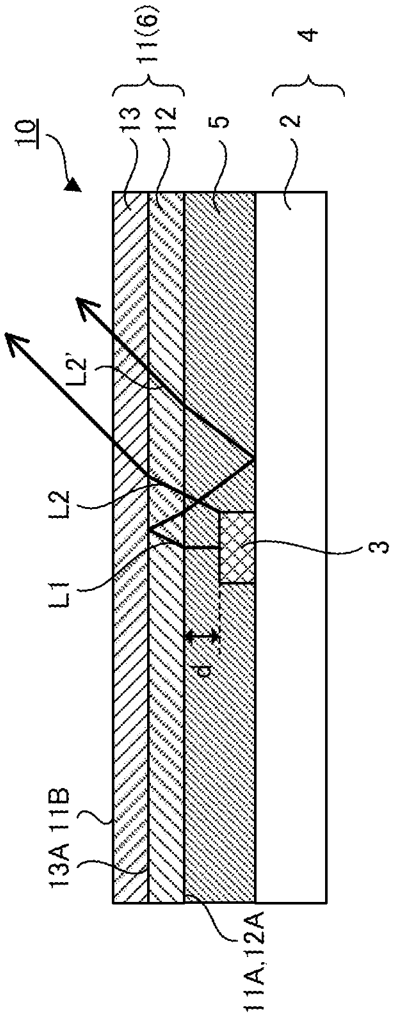
FIG. 5 is a schematic cross-sectional view illustrating an example of a surface-emitting device provided with a second diffusion member in the present disclosure.

FIG. 5 is a schematic cross-sectional view illustrating an example of a surface-emitting device in the present disclosure including the second diffusion member shown in FIG. 4. As shown in FIG. 5, the surface-emitting device 10 comprises the light-emitting diode substrate 4 including the LED element 3 placed on one surface of supporting substrate 2; the sealing member 5 placed on the light-emitting diode element 3 side surface of the light-emitting diode substrate 4, and configured to seal the light-emitting diode element 3; and the diffusion member 11 placed on the sealing member 5, on the opposite surface side to the light-emitting diode substrate 4 side. The diffusion member 11 is placed so that the first layer 12 side surface 11A faces the sealing member 5.

As shown in FIG. 4, it is possible to diffuse the incident light from the first layer 12 side surface 11A of the diffusion member 11 by the first layer 12, as well as to reflect incident light L1 with low incident angle θ1 with respect to the first layer 12 side surface 13A of the second layer 13, among the light transmitted and diffused through the first layer 12, by the first layer 12 side surface 13A of the second layer 13, and to diffuse by entering into the first layer 12 again, as shown in FIG. 5. Also, among the light transmitted and diffused through the first layer 12, incident light L2 and L2' with high incident angle θ2 with respect to the first layer 12 side surface 13A of the second layer 13 may be transmitted through the second layer 13, and may be emitted from the second layer 13 side surface 11B of the diffusion member 11. Also, by combining the first layer and the second layer, incident light from the first layer side surface of the diffusion member, in particular, incident light with low incident angle from the first layer side surface of the diffusion member may be diffused by transmitting through the first layer many times, so that it may be emitted with high emitting angle from the second layer side surface of the diffusion member. Therefore, in the surface-emitting device including such diffusion member (particularly the downlight type system LED backlight), the light emitted from the light-emitting diode element may be diffused to the entire light emitting surface, thereby further improving the in-plane uniformity of luminance.

Also, by combining the first layer and the second layer, since the incident light with low incident angle from the first layer side surface of the diffusion member may be transmitted through the first layer many times, the optical route length from the point where the light enters from the first layer side surface of the diffusion member to the point where the light is emitted from the second layer side surface of the diffusion member, may be increased. This makes it possible to emit a part of the light, emitted from the light-emitting diode element and then emitted from the second layer side surface of diffusion member, from a position away from the LED element in in-plane direction, rather than directly above the light-emitting diode element.

1. First Layer

The first layer in the present disclosure is a member placed on one surface side of the second layer described later, and has light transmissivity and light diffusivity. As the light transmissivity of the first layer, for example, the total light transmittance of the first layer is preferably 50% or more, and among the above, preferably 70% or more, and particularly preferably 90% or more. By the total light transmittance of the first layer being in the range described above, the luminance of the surface-emitting device in the present disclosure may be increased.

Incidentally, the total light transmittance of the first layer may be measured, for example, by a method according to JIS K7361-1: 1997.

The light diffusivity of the first layer may be, for example, a light diffusivity that randomly diffuses light, and may be a light diffusivity that diffuses light mainly in a certain direction. The light diffusivity that diffuses light mainly in a certain direction is a property of deflecting light, that is, a property of changing the traveling direction of the light. As the light diffusivity of the first layer, when light diffusivity is a light diffusivity that randomly diffuses light, for example, the diffusion angle of the light entering the first layer may be 10° or more, may be 15° or more, and may be 20° or more. Also, the diffusion angle of the light entering the first layer may be, for example, 85° or less, may be 60° or less, and may be 50° or less. By the diffusion angle being in the range described above, the in-plane uniformity of luminance of the surface-emitting device in the present disclosure may further be improved.

Figure 6:
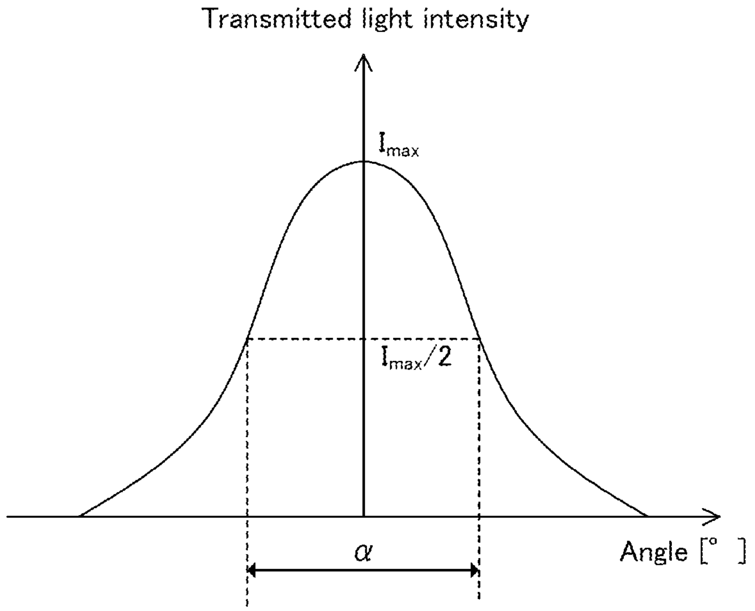
FIG. 6 is a graph illustrating an example of a transmitted light intensity distribution.

Here, the diffusion angle will be described. FIG. 6 is a graph illustrating an example of a transmitted light intensity distribution, and is a diagram explaining a diffusion angle. In the present descriptions, a half-width (FWHM) that is a difference between two angles those are ½ of maximum transmitted light intensity Imax of the light perpendicularly enters to one surface of the first layer constituting the diffusion member and emits from the other surface of the first layer, is defined as a diffusion angle α.

Incidentally, the diffusion angle may be measured using a goniophotometer or a deflection angle spectrophotometric colorimeter. For measuring the diffusion angle, for example, a goniophotometer GP-200 from Murakami Color Research Laboratory may be used.

The first layer is not particularly limited as long as it has the light transmissivity and light diffusivity described above, and examples thereof may include a transmission type diffractive grating; a microlens array; and a diffusion agent-containing resin film containing a diffusion agent, and a resin. Specifically, when the first layer has a light diffusivity that diffuses light mainly in a certain direction, examples thereof may include a transmission type diffractive grating, and microlens array. Meanwhile, when the first layer has a light diffusivity that randomly diffuses light, examples thereof may include a diffusion agent-containing resin film. Among them, the transmission type diffractive grating and the microlens array are preferable from the viewpoint of light diffusivity. Incidentally, the transmission type diffractive grating is also referred to as a transmission type diffractive optical element (DOE).

When the first layer is a transmission type diffractive grating, the transmission type diffractive grating is not particularly limited as long as it has the light transmissivity and light diffusivity described above. The pitch, for example, of the transmission type diffractive grating may be appropriately adjusted so as to obtain the light transmissivity and light diffusivity described above. Specifically, when the wavelength of the light output by the LED element is a single color such as red, green, and blue, the light from the light-emitting diode element may be effectively bent by setting the pitch according to the respective wavelengths.

As the material constituting the transmission type diffractive grating, any material may be used as long as a transmission type diffractive grating having the light transmissivity and light diffusivity described above may be obtained, and a material usually used for a transmission type diffractive grating may be used. Also, the method for forming a transmission type diffractive grating may be similar to the method for forming a common transmission type diffractive grating.

When the first layer is a microlens array, the microlens array is not particularly limited as long as it has the light transmissivity and light diffusivity described above. The shape, pitch, and size, for example, of the microlens may be appropriately adjusted so as to obtain the light transmissivity and light diffusivity described above. As a material constituting the microlens, any material may be used as long as a microlens having the light transmissivity and light diffusivity described above may be obtained, and a material commonly used for a microlens may be employed. Also, the method for forming a microlens may be similar to a common method for forming a microlens.

When the first layer is a diffusion agent-containing resin film, the diffusion agent-containing resin film is not particularly limited as long as it has the light transmissivity and light diffusivity described above.

The first layer may have any structure capable of exhibiting light diffusivity; for example, the light diffusivity may be exhibited with the entire layer, and the light diffusivity may be exhibited with the surface thereof. Examples of the structure wherein the light diffusivity is exhibited with the surface thereof may include a relief type diffractive grating and a microlens array. Meanwhile, examples of the structure wherein the light diffusivity is exhibited with the entire layer may include a volume type diffractive grating and a diffusion agent-containing resin film. Examples of the method for stacking the first layer and the second layer may include a method wherein the first layer and the second layer are adhered via an adhesive layer or a pressure-sensitive adhesive layer; and a method wherein the first layer is formed directly on one surface of the second layer. Examples of a method for forming the first layer directly on one surface of the second layer may include a printing method, and a resin shaping by a mold.

2. Second Layer

The second layer in the present disclosure is a member placed on one surface side of the first layer, and has an incident angle dependency in reflectance wherein a reflectance of light increases as an absolute value of an incident angle with respect to a first layer side surface of the second layer decreases; and an incident angle dependency in transmittance wherein a transmittance of light increases as an absolute value of an incident angle with respect to a first layer side surface of the second layer increases.

The second layer has an incident angle dependency in reflectance such that a reflectance of light increases as an absolute value of an incident angle with respect to a first layer side surface of the second layer decreases. That is, the reflectance of incident light with a low incident angle with respect to the first layer side surface of the second layer is larger than the reflectance of incident light with a high incident angle with respect to the first layer side surface of the second layer. Among the above, the reflectance of incident light with a low incident angle with respect to the first layer side surface of the second layer is preferably large.

Specifically, the regular reflectance of visible incident light to the first layer side surface of the second layer with an incident angle of within ±60° is preferably 50% or more and less than 100%, more preferably 80% or more and less than 100%, and particularly preferably 90% or more and less than 100%. Incidentally, for all incident angles with the incident angle of within ±60°, it is preferable that the regular reflectance of the visible light satisfies the range described above. When the regular reflectance is in the range described above, the in-plane uniformity of luminance of the surface-emitting device in the present disclosure may further be improved.

Also, the average value of the regular reflectance of visible incident light to the first layer side surface of the second layer with the incident angle of within ±60° is preferably, for example, 80% or more and 99% or less, and more preferably 90% or more and 97% or less. Incidentally, the average value of the regular reflectance refers to an average value of the regular reflectance of the visible light at the respective incident angles. By the average value of the regular reflectance being in the range described above, the in-plane uniformity of luminance of the surface-emitting device in the present disclosure may further be improved.

Also, the regular reflectance of visible incident light to the first layer side surface of the second layer with an incident angle of 0° (perpendicularly incident) is preferably, for example, 80% or more and less than 100%, more preferably 90% or more and less than 100%, and particularly preferably 95% or more and less than 100%. By the regular reflectance being in the range described above, the in-plane uniformity of luminance of the surface-emitting device in the present disclosure may further be improved.

Incidentally, in the present descriptions, "visible light" means light having a wavelength of 380 nm or more and 780 nm or less. Also, the regular reflectance may be measured using a goniophotometer and a deflection angle spectrophotometric colorimeter. For measuring the regular reflectance, for example, a goniophotometer GP-200 from Murakami Color Research Laboratory may be used.

The second layer has an incident angle dependency in transmittance such that a transmittance of light increases as an absolute value of an incident angle with respect to a first layer side surface of the second layer increases. That is, the transmittance of the incident light with a high incident angle with respect to the first layer side surface of the second layer is larger than the transmittance of the incident light with a low incident angle with respect to the first layer side surface of the second layer. Among the above, the transmittance of incident light with a high incident angle with respect to the first layer side surface of the second layer is preferably large. Specifically, the total light transmittance of the incident light with an incident angle of 70° or more and less than 90°, with respect to the first layer side surface of the second layer, is preferably 30% or more, more preferably 40% or more, and particularly preferably 50% or more. Incidentally, for all incident angles with the incident angle of 70° or more and less than 90°, it is preferable that the total light transmittance satisfies the range described above. Also, when the absolute value of the incident angle is 70° or more and less than 90°, it is preferable that the total light transmittance satisfies the range described above. By the total light transmittance being in the range described above, the in-plane uniformity of luminance of the surface-emitting device in the present disclosure may further be improved.

Incidentally, the total light transmittance of the second layer may be measured by, for example, using a goniophotometer and a deflection angle spectrophotometric colorimeter by a method according to JIS K7361-1: 1997. For measuring the total light transmittance, for example, an ultraviolet-visible near-infrared spectrophotometer V-7200 from JASCO Corporation may be used.

The second layer is not particularly limited as long as it has the incident angle dependency in reflectance and transmittance described above, and various configurations having the incident angle dependency in reflectance and transmittance described above may be employed. Examples of the second layer may include a dielectric multi-layer film; a reflective structure including a first reflective film in a pattern form and a second reflective film in a pattern form, in this order from the first layer side, wherein the opening of the first reflective film and the opening of the second reflective film are placed so as not to overlap in a plan view, and the first reflective film and the second reflective film are placed apart from each other in the thickness direction; and a reflection type diffractive grating.

A case wherein the second layer is a dielectric multi-layer film, a reflective structure, or a reflection type diffractive grating is hereinafter explained.

(1) Dielectric Multi-Layer Film

When the second layer is a dielectric multi-layer film, examples of the dielectric multi-layer film may include a multi-layer film of an inorganic compound wherein inorganic material layers having different refractive indices are alternately stacked; and a multi-layer film of a resin wherein resin layers having different refractive indices are alternately stacked.

(Multi-Layer Film of Inorganic Compound)

When the dielectric multi-layer film is a multi-layer film of an inorganic compound wherein inorganic material layers having different refractive indices are alternately stacked, the multi-layer film of an inorganic compound is not particularly limited as long as it has the incident angle dependency in reflectance and transmittance described above.

Among the inorganic material layers having different refractive indices, the refractive index of the inorganic compound included in a high refractive index inorganic material layer having a high refractive index may be, for example, 1.7 or more, and may be 1.7 or more and 2.5 or less. Examples of such inorganic compound may include one including titanium oxide, zirconium oxide, tantalum pentaoxide, niobium pentaoxide, lanthanum oxide, yttrium oxide, zinc oxide, zinc sulfide, or indium oxide as a main component, and including a small amount of, for example, titanium oxide, tin oxide, or cerium oxide.

Also, among the inorganic material layers having different refractive indices, the refractive index of the inorganic compound included in a low refractive index inorganic material layer having a low refractive index may be, for example, 1.6 or less, and may be 1.2 or more and 1.6 or less. Examples of such inorganic compound may include silica, alumina, lanthanum fluoride, magnesium fluoride, and sodium aluminum hexafluoride.

The number of the stacked layers of the high refractive index inorganic layer and the low refractive index inorganic layer may be appropriately adjusted so as to obtain the incident angle dependency in reflectance and transmittance described above. Specifically, the total number of stacked layers of the high refractive index inorganic layer and the low refractive index inorganic layer may be 4 layers or more. Also, the upper limit of the total number of stacked layers is not particularly limited; and since the increase in the number of stacked layers increases the number of processing steps, it may be, for example, 24 layers or less.

As the thickness of the multi-layer film of the inorganic compound, it may be any thickness as long as the incident angle dependency in reflectance and transmittance described above may be obtained, and may be, for example, 0.5 μm or more and 10 μm or less. Examples of a method for forming a multi-layer film of an inorganic compound may include a method wherein the high refractive index inorganic layer and low refractive index inorganic layer are alternately stacked by, for example, a CVD method, a sputtering method, a vacuum deposition method, and a wet coating method.

(Multi-Layer Film of Resin)

When the dielectric multi-layer film is a multi-layer film of a resin wherein resin layers having different refractive indices are alternately stacked, the multi-layer film of a resin is not particularly limited as long as it has the incident angle dependency in reflectance and transmittance described above.

Examples of the resin constituting the resin layer may include a thermoplastic resin and a thermosetting resin. Among them, a thermoplastic resin is preferable because of its good molding ability.

Various additives such as an antioxidant, an antistatic agent, a crystal nucleating agent, an inorganic particle, an organic particle, a viscosity reducing agent, a heat stabilizer, a lubricant, an infrared absorber, an ultraviolet absorber, and a doping agent for adjusting the refractive index may be added to the resin layer.

As the thermoplastic resin, for example, polyolefin resins such as polyethylene, polypropylene, polystyrene, and polymethylpentene; alicyclic polyolefin resins; polyamide resins such as nylon 6 and nylon 66; aramid resins; polyester resins such as polyethylene terephthalate, polybutylene terephthalate, polypropylene terephthalate, polybutyl succinate, and polyethylene-2,6-naphthalate; polycarbonate resin; polyarylate resin; polyacetal resin; polyphenylene sulfide resin; a fluororesin such as tetrafluoride ethylene resin, trifluoride ethylene resin, trifluorochloroethylene resin, tetrafluoroethylene-hexafluoropropylene copolymer, and a vinylidene fluoride resin; an acrylic resin; a methacrylic resin; a polyacetal resin; a polyglycolic acid resin; and a polylactic acid resin may be used. Among them, polyester is more preferable from the viewpoint of strength, heat resistance, and transparency.

In the present descriptions, a polyester refers to a homopolyester or a copolymer polyester which is a polycondensate of a dicarboxylic acid component skeleton and a diol component skeleton. Here, examples of the homopolyester may include polyethylene terephthalate, polypropylene terephthalate, polybutylene terephthalate, polyethylene-2,6-naphthalate, poly-1,4-cyclohexanedimethylene terephthalate, and polyethylene diphenylate. Among them, polyethylene terephthalate is preferable because of its low cost so that it may be used in a very wide variety of applications.

Also, in the present descriptions, a copolymer polyester is defined as a polycondensate including at least three or more components selected from a component having a dicarboxylic acid skeleton and a component having a diol skeleton described below. Examples of the component having a dicarboxylic acid skeleton may include terephthalic acid, isophthalic acid, phthalic acid, 1,4-naphthalenedicarboxylic acid, 1,5-naphthalenedicarboxylic acid, 2,6-naphthalenedicarboxylic acid, 4,4-diphenyldicarboxylic acid, 4,4-diphenylsulfondicarboxylic acid, adipic acid, sebacic acid, dimer acid, cyclohexanedicarboxylic acid and ester derivatives thereof. Examples of the component having a glycol skeleton may include ethylene glycol, 1,2-propanediol, 1,3-butanediol, 1,4-butanediol, 1,5-pentadiol, diethylene glycol, polyalkylene glycol, 2,2-bis(4-R-hydroxyethoxyphenyl) propane, isosorbate, 1,4-cyclohexanedimethanol, and spiroglycol.

Among the resin layers having different refractive indices, the difference in in-plane average refractive index between the high refractive index resin layer having a high refractive index and the low refractive index resin layer having a low refractive index is preferably 0.03 or more, more preferably 0.05 or more, and still more preferably 0.1 or more. When the difference in the in-plane average refractive index is too small, sufficient reflectance may not be obtained.

Also, the difference between the in-plane average refractive index and the thickness direction refractive index of the high refractive index resin layer is preferably 0.03 or more, and the difference between the in-plane average refractive index and the thickness direction refractive index of the low refractive index resin layer is preferably 0.03 or less. In this case, the reflectance at the reflectance peak is less likely to be decreased, even when the incident angle is increased.

As a preferable combination of a high refractive index resin used in the high refractive index resin layer and a low refractive index resin used in the low refractive index resin layer, firstly, the absolute value of the difference in the SP value of the high refractive index resin and the low refractive index resin is preferably 1.0 or less. When the absolute value of the difference in the SP value is in the range described above, delamination between layers is less likely to occur. In this case, it is more preferable that the high refractive index resin and the low refractive index resin include the same basic skeleton. Here, the basic skeleton is a repeating unit constituting the resin. For example, when one of the resins is polyethylene terephthalate, ethylene terephthalate is a basic skeleton. Also, for example, when one of the resins is polyethylene, ethylene is a basic skeleton. When the high refractive index resin and the low refractive index resin are resins including the same basic skeleton, delamination between layers is further less likely to occur.

As a preferable combination of a high refractive index resin used in the high refractive index resin layer and a low refractive index resin used in the low refractive index resin layer, secondly, it is preferable that the difference in the glass transition temperature of the high refractive index resin and the low refractive index resin is 20° C. or less. When the difference in the glass transition temperature is too large, thickness uniformity may become poor when a stacked film of a high refractive index resin layer and a low refractive index resin layer is formed. Also, when the stacked film is formed, overstretching may occur in some cases.

Also, it is preferable that the high refractive index resin is polyethylene terephthalate or polyethylene naphthalate, and the low refractive index resin is a polyester including spiroglycol. Here, the polyester including spiroglycol refers to a copolyester obtained by copolymerizing spiroglycol, or a homopolyester, or a polyester obtained by blending them. Since the difference in glass transition temperature between the polyester including spiroglycol, and polyethylene terephthalate or polyethylene naphthalate is small, it is preferable that the overstretching in production thereof is less likely to occur, as well as the delamination between layers is less likely to occur. More preferably, it is preferable that the high refractive index resin is polyethylene terephthalate or polyethylene naphthalate, and the low refractive index resin is a polyester including spiroglycol and cyclohexanedicarboxylic acid. When the low refractive index resin is the polyester including spiroglycol and cyclohexanedicarboxylic acid, the difference in in-plane refractive index from polyethylene terephthalate or polyethylene naphthalate is large, so that a high reflectance is easily obtained. Also, since the difference in glass transition temperature from polyethylene terephthalate or polyethylene naphthalate is small, and the adhesive property is also excellent, the overstretching in production thereof is less likely to occur, as well as the delamination between layers is less likely to occur.

Further, it is also preferable that the high refractive index resin is polyethylene terephthalate or polyethylene naphthalate, and the low refractive index resin is a polyester including cyclohexanedimethanol. Here, the polyester including cyclohexanedimethanol refers to a copolyester obtained by copolymerizing cyclohexanedimethanol, or a homopolyester, or a polyester obtained by blending them. Since the difference in glass transition temperature between the polyester including cyclohexanedimethanol and polyethylene terephthalate or polyethylene naphthalate is small, it is preferable that the overstretching in production thereof is less likely to occur, as well as the delamination between layers is less likely to occur. In this case, the low refractive index resin is more preferably an ethylene terephthalate polycondensate wherein a copolymerization amount of cyclohexanedimethanol is 15 mol % or more and 60 mol % or less. Thereby, a change in optical property due to heating or time is particularly small, while having a high reflectance, so that the delamination between layers is less likely to occur. An ethylene terephthalate polycondensate wherein the copolymerization amount of cyclohexanedimethanol is in the range described above, is very strongly adhered to polyethylene terephthalate. Also, since the cyclohexanedimethanol group includes a cis form or a trans form as geometric isomers, and also includes a chair type or a boat type as conformers, an orientation crystallization is less likely to occur even when it is co-stretched with polyethylene terephthalate; has a high reflectance; a change in optical property due to a thermal history is further small; and a breakage during film formation is less likely to occur.

In the multi-layer film of the resin described above, a portion having a structure wherein a high refractive index resin layer and a low refractive index resin layer are alternately stacked in the thickness direction, may exist. That is, it is preferable that the arrangement order of the high refractive index resin layer and the low refractive index resin layer in the thickness direction is not a random state, and the arrangement order of the resin layers other than the high refractive index resin layer and the low refractive index resin layer is not particularly limited. Also, when the multi-layer film of the resin includes a high refractive index resin layer, a low refractive index resin layer, and the other resin layer, the arrangement order of these layers is more preferable that the respective layers are stacked in a regular sequence such as $A(BCA)_n$, $A(BCBA)_n$, and $A(BABCBA)_n$, when the high refractive index resin layer is regarded as “A”, the low refractive index resin layer is regarded as “B”, and the other resin layer is regarded as “C”. Here, “n” is the number of repeating units, and when n=3 in $A(BCA)_n$, for example, it represents one stacked in the order of ABCABCABCA in the thickness direction.

Also, the stacked number of the high refractive index resin layer and the low refractive index resin layer may be appropriately adjusted so as to obtain the incident angle dependency in reflectance and transmittance described above. Specifically, 30 layers or more respective layers of the high refractive index resin layer and the low refractive index resin layer may be stacked alternately, and 200 layers or more respective layers may be stacked. The total number of stacked layers of the high refractive index resin layer and the low refractive index resin layer may be, for example, 600 layers or more. When the number of the stacked layers is too small, sufficient reflectance may not be obtained. Also, by the number of stacked layers being in the range described above, a desired reflectance may be easily obtained. Also, the upper limit of the total number of stacked layers is not particularly limited, and may be, for example, 1500 layers or less, in consideration of the increase in size of the device and the decrease in stacking accuracy due to an excessively large number of layers.

Further, it is preferable that the multi-layer film of a resin includes a surface layer including polyethylene terephthalate or polyethylene naphthalate having a thickness of 3 μm or more, on at least one surface, and among the above, it is preferable to include the surface layer on both surfaces. Also, the thickness of the surface layer is more preferably 5 μm or more. By including the surface layer, the surface of the multi-layer film of a resin may be protected.

Examples of a method for producing the multi-layer film of a resin may include a co-extrusion method. Specifically, reference may be made to a method for producing a stacked film described in Japanese Patent Application Laid-Open (JP-A) No. 2008-200861.

Further, as the multi-layer film of a resin, a commercially available stacked film may be used, and specific examples thereof may include Picassas (registered trademark) from Toray Industries, Ltd., and ESR from 3M Co., Ltd.

(2) Reflective Structure

The reflective structure includes a first reflective film in a pattern form and a second reflective film in a pattern form, in this order from the first layer side, wherein the opening of the first reflective film and the opening of the second reflective film are placed so as not to overlap in a plan view, and the first reflective film and the second reflective film are placed apart from each other in the thickness direction.

The reflective structure may be classified into two aspects. The first aspect of the reflective structure includes a transparent substrate, a first reflective film in a pattern form placed on one surface of the transparent substrate, and a second reflective film in a pattern form placed on the other surface of the transparent substrate, wherein the opening of the first reflective film and the opening of the second reflective film are placed so as not to overlap in a plan view; and the first reflective film and the second reflective film are placed apart from each other in the thickness direction. Also, the second aspect of the reflective structure includes a transparent substrate; a convex portion in a pattern form, having a light transmissivity, placed on one surface of the transparent substrate; a first reflective film in a pattern form placed on the opposite surface side to the transparent substrate side surface of the convex portion; and a second reflective film in a pattern form placed on the opening of the convex portion on one surface of the transparent substrate, wherein the opening of the first reflective film and the opening of the second reflective film are placed so as not to overlap in a plan view; and the first reflective film and the second reflective film are placed apart from each other in the thickness direction. Hereinafter, each aspect will be described separately.

(First Aspect of Reflective Structure)

The first aspect of the reflective structure in the present disclosure includes a transparent substrate, a first reflective film in a pattern form placed on one surface of the transparent substrate, and a second reflective film in a pattern form placed on the other surface of the transparent substrate, wherein the opening of the first reflective film and the opening of the second reflective film are placed so as not to overlap in a plan view, and the first reflective film and the second reflective film are placed apart from each other in the thickness direction. In the case of the reflective structure in the present aspect, in the second diffusion member, the first layer is placed on the first reflective film side surface of the reflective structure.

Figure 7A:
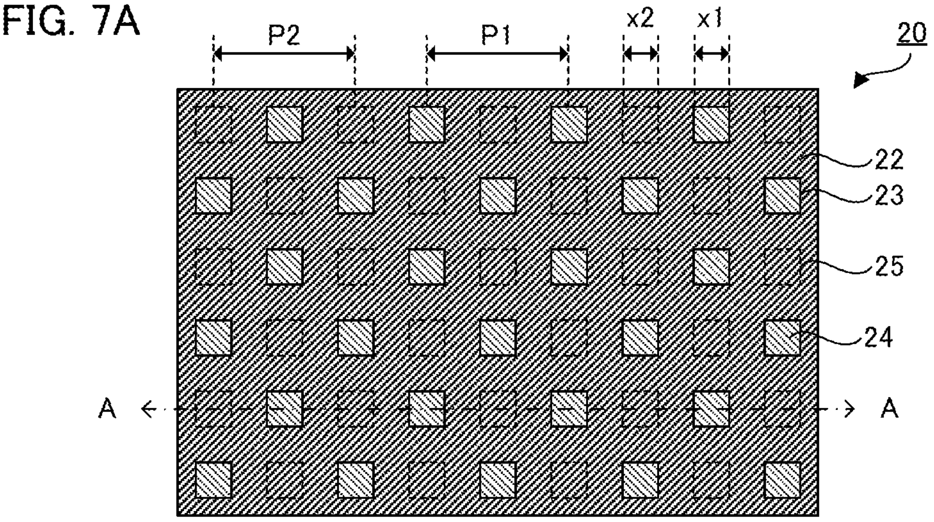
FIGS. 7A to 7C are a schematic plan view and schematic cross-sectional views illustrating an example of the first aspect of the reflective structure of the second diffusion member.
Figure 7B:
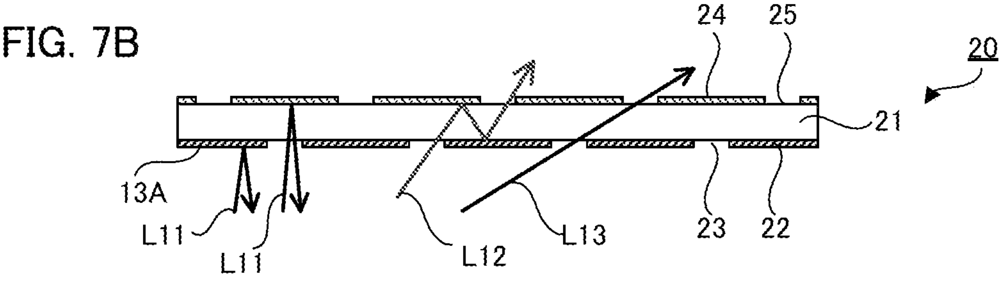
Figure 7C:
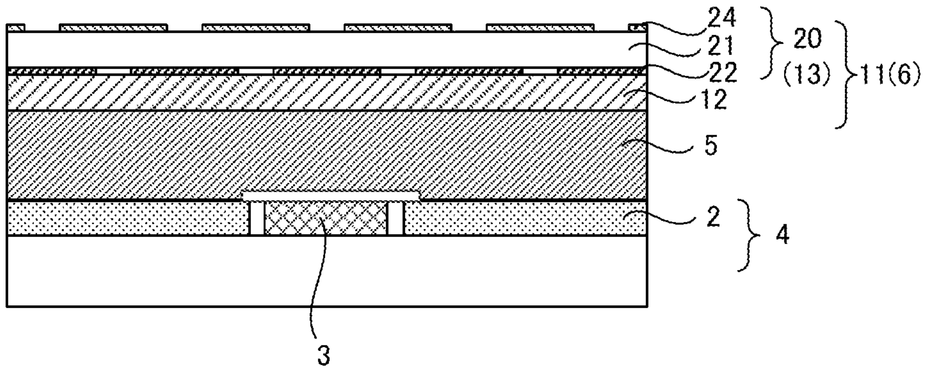
Figure 8A:
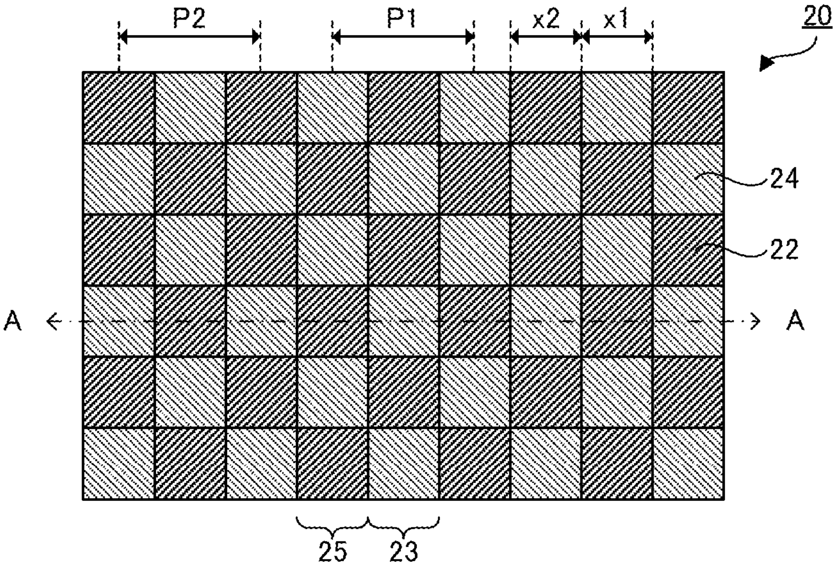
FIGS. 8A and 8B are a schematic plan view and a schematic cross-sectional view illustrating an example of the second aspect of the reflective structure of the second diffusion member.
Figure 8B:
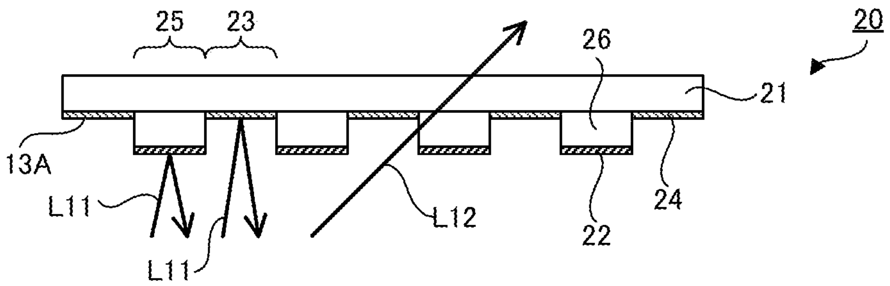

FIGS. 7A and 8B are a schematic plan view and a schematic cross-sectional view illustrating an example of a reflective structure in the present aspect; FIG. 7A is a plan view viewed from the first reflective film side surface of the reflective structure; and FIG. 7B is a line A-A cross-sectional view of FIG. 7A. As shown in FIGS. 7A and 7B, a reflective structure 20 includes a transparent substrate 21, a first reflective film 22 in a pattern form placed on one surface of the transparent substrate 21, and a second reflective film 24 placed on the other surface of the transparent substrate 21, wherein an opening 23 of the first reflective film 22 and an opening 25 of the second reflective film 24 are placed so as not to overlap in a plan view. Also, the first reflective film 22 and the second reflective film 24 are placed on each surface of the transparent substrate 21, and placed apart from each other in the thickness direction. Incidentally, in FIG. 7A, the opening of the second reflective film is indicated by a broken line. Also, FIG. 7C is a schematic cross-sectional view illustrating an example of the surface-emitting device including the diffusion member including the reflective structure in the present aspect.

In such reflective structure, the first reflective film and the second reflective film in a pattern form are stacked, and since the opening of the first reflective film and the opening of the second reflective film are placed so as not to overlap in a plan view, when the diffusion member including the reflective structure in the present aspect is used for a surface-emitting device, as shown in FIG. 7C, for example, at least one of the first reflective film 22 and the second reflective film 24 will always be present at directly above the light-emitting diode element 3. Therefore, as shown in FIG. 7B for example, it is possible to reflect incident light L11 with low incident angle with respect to the first reflective film 22 side surface of the reflective structure 20, that is, the surface 13A of the side wherein the first layer (not shown in the figure) of the reflective structure 20 (second layer) is placed, by the first reflective film 22 and the second reflective film 24. Also, since the opening of the first reflective film and the opening of the second reflective film are placed so as not to overlap in a plan view, and since the first reflective film and the second reflective film are placed apart from each other in the thickness direction, it is possible to emit incident light L12, L13 with high incident angle with respect to the first reflective film 22 side surface of the reflective structure 20, that is, surface the 13A of the side wherein the first layer (not shown in the figure) of the reflective structure 20 (second layer) is placed, from the opening 23 of the first reflective film 22 and the opening 25 of the second reflective film 24. Thereby, a part of the light emitted from the light-emitting diode element, and then, emitted from the second layer side surface of the diffusion member may be emitted from a position away from the light-emitting diode element in in-plane direction, rather than directly above the light-emitting diode element. Therefore, in-plane uniformity of luminance may be improved.

As the first reflective film and the second reflective film, a common reflective film may be used, and for example, a metal film, and a dielectric multi-layer film may be used. As a material of the metal film, a metal material used for a common reflective film may be employed, and examples thereof may include aluminum, gold, silver, and alloys thereof. Also, as the dielectric multi-layer film, a film used for a common reflective film may be employed, and examples thereof may include a multi-layer film of an inorganic compound such as a multi-layer film wherein zirconium oxide and silicon oxide are alternately stacked. The materials included in the first reflective film and the second reflective film may be the same, and may be different from each other.

The pitch of the openings of the first reflective film and the second reflective film may be such that the incident angle dependency in reflectance and transmittance described above is obtained, and is appropriately set according to, for example, the light distribution property, size, pitch and shape of the light-emitting diode element in the surface-emitting device wherein the diffusion member in the present aspect is used, and the distance between the light-emitting diode substrate and the diffusion member. The pitch of the opening of the first reflective film and the second reflective film may be the same, and may be different from each other.

The pitch of the opening of the first reflective film may be larger than the size of the LED element, for example. Specifically, the pitch of the opening of the first reflective film may be 0.1 mm or more and 20 mm or less.

Also, the pitch of the opening of the second reflective film is not particularly limited as long as it may suppress luminance unevenness, and among the above, it is preferable that the pitch is equal to or less than the pitch of the opening of the first reflective film, and it is preferable that the pitch is less than the pitch of the opening of the first reflective film. Specifically, the pitch of the opening of the second reflective film may be 0.1 mm or more and 2 mm or less. By making the pitch of the opening of the second reflective film as fine as described above, the pattern of the second reflective film portion and the opening portion of the second reflective film may be made difficult to visually recognize, so that a surface emission without unevenness is possible.

Incidentally, the pitch of the opening of the first reflective film refers to distance "P1" between the centers of adjacent openings 23 of the first reflective film 22 as shown in FIG. 7A for example. Also, the pitch of the opening of the second reflective film refers to distance "P2" between the centers of adjacent openings 25 of the second reflective film 24 as shown in FIG. 7A for example.

The size of the opening of the first reflective film and the second reflective film may be such that the incident angle dependency in reflectance and transmittance described above is obtained, and is appropriately set according to, for example, the light distribution property, size, pitch and shape of the LED element, and the distance between the LED substrate and the diffusion member. The size of the opening of the first reflective film and the second reflective film may be the same, and may be different from each other.

As the size of the opening of the first reflective film, specifically, when the shape of the opening of the first reflective film is a rectangular shape, the length of the opening of the first reflective film may be 0.1 mm or more and 5 mm or less.

Also, the size of the opening of the second reflective film is not particularly limited as long as it may suppress luminance unevenness, and among the above, it is preferable that the size is equal to or less than the size of the opening of the first reflective film, and it is preferable that the size is less than the size of the opening of the first reflective film. Specifically, when the shape of the opening of the second reflective film is a rectangular shape, the length of the opening of the second reflective film may be 0.05 mm or more and 2 mm or less. By making the size of the opening of the second reflective film as fine as described above, the pattern of the second reflective film portion and the opening portion of the second reflective film may be made difficult to visually recognize, so that a surface emission without unevenness is possible.

Incidentally, when the shape of the opening of the first reflective film is a rectangular shape, the size of the opening of the first reflective film refers to, for example, length "x1" of opening 23 of first reflective film 22 as shown in FIG. 7A. Also, the size of the opening of the second reflective film refers to, for example, length "×2" of opening 25 of second reflective film 24 as shown in FIG. 7A.

The opening of the first reflective film and the second reflective film may have any shape, such as a rectangular shape, and a circular shape. The thicknesses of the first reflective film and the second reflective film may be appropriately adjusted such that the incident angle dependency in reflectance and transmittance described above is obtained. Specifically, the thickness of the first reflective film and the second reflective film may be 0.05 μm or more and 100 μm or less.

The first reflective film and the second reflective film may be formed on the surface of the transparent substrate, and may be a sheet shaped reflective film. A method for forming the first reflective film and the second reflective film is not particularly limited as long as a reflective film in a pattern form may be formed on the surface of the transparent substrate, and examples thereof may include a sputtering method, and a vacuum deposition method. Also, when the first reflective film and the second reflective film are sheet shaped reflective films, examples of a method for forming an opening may include a method wherein a plurality of through holes are formed by, for example, a punching process. In this case, as a method for stacking the transparent substrate and the sheet shaped reflective film, for example, a method wherein a sheet shaped reflective film is adhered to a transparent substrate via an adhesive layer or a pressure-sensitive adhesive layer, may be used.

The transparent substrate in the reflective structure in the present aspect is a member configured to support, for example, the first reflective film, and the second reflective film, and is a member configured to place the first reflective film and the second reflective film apart from each other in the thickness direction.

The transparent substrate has light transmissivity. As the light transmissivity of the transparent substrate, the total light transmittance of the transparent substrate is preferably, for example, 80% or more, and among the above, preferably 90% or more.

Incidentally, the total light transmittance of the transparent substrate may be measured, for example, by a method according to JIS K7361-1: 1997.

As a material constituting the transparent substrate, any material having the total light transmittance described above may be used, and examples thereof may include resins such as polyethylene terephthalate, polycarbonate, acrylic, cycloolefin, polyester, polystyrene, and acrylic styrene; and glasses such as quartz glass, Pyrex (registered trade name), and synthetic quartz.

As shown in FIG. 7B for example, the thickness of the transparent substrate is preferably a thickness such that incident light L12 with high incident angle with respect to the first reflective film 22 side surface of the reflective structure 20, that is, the surface 13A of the side wherein the first layer (not shown in the figure) of the reflective structure 20 (second layer) is placed, may be emitted from the opening 23 of the first reflective film 22 and the opening 25 of the second reflective film 24. The thickness of the transparent substrate is appropriately set according to, for example, the pitch and the size of the opening of the first reflective film and the second reflective film, and the thickness of the first reflective film and the second reflective film. Specifically, the thickness of the transparent substrate may be 0.05 mm or more and 2 mm or less, and among them, is preferably 0.1 mm or more and 0.5 mm or less.

(Second Aspect of Reflective Structure)

The second aspect of the reflective structure includes a transparent substrate; a convex portion in a pattern form placed on one surface of the transparent substrate and having a light transmissivity; a first reflective film in a pattern form placed on the opposite surface side to the transparent substrate side surface of the convex portion; and a second reflective film in a pattern form placed on the opening of the convex portion on one surface of the transparent substrate, wherein the opening of the first reflective film and the opening of the second reflective film are placed so as not to overlap in a plan view, and the first reflective film and the second reflective film are placed apart from each other in the thickness direction. In the case of the reflective structure in the present aspect, in the second diffusion member, the first layer is placed on the first reflective film side surface of the reflective structure.

FIGS. 8A and 8B are a schematic plan view and a schematic cross-sectional view illustrating an example of the second aspect of the reflective structure in the present disclosure, FIG. 8A is a plan view viewed from the first reflective film side surface of the reflective structure, and FIG. 8B is a line A-A cross-sectional view of FIG. 8A. As shown in FIGS. 8A and 8B, a reflective structure 20 includes a transparent substrate 21; a convex portion 26 in a pattern form placed on one surface of the transparent substrate 21 and having a light transmissivity; a first reflective film 22 in a pattern form placed on the opposite surface to the transparent substrate 21 side surface of the convex portion 26; and a second reflective film 24 in a pattern form placed on the opening of the convex portion 26 on one surface of the transparent substrate 21. The opening 23 of the first reflective film 22 and the opening 25 of the second reflective film 24 are placed so as not to overlap in a plan view. Also, the first reflective film 22 and the second reflective film 24 are separated by the convex portion 26, and are placed apart from each other in the thickness direction.

In such reflective structure, the first reflective film and the second reflective film in a pattern form are stacked, and since the opening of the first reflective film and the opening of the second reflective film are placed so as not to overlap in a plan view, in the surface-emitting device (particularly LED backlight) using the diffusion member including the reflective structure in the present aspect, at least one of the first reflective film and the second reflective film will always be present at directly above the LED element. Therefore, similar to the reflective structure of the first aspect, as shown in FIG. 8B for example, it is possible to reflect incident light L11 with low incident angle with respect to the first reflective film 22 side surface of the reflective structure 20, that is, the surface 13A of the side wherein the first layer (not shown in the figure) of the reflective structure 20 (second layer) is placed, by the first reflective film 22 and the second reflective film 24. Also, since the opening of the first reflective film and the opening of the second reflective film are placed so as not to overlap in a plan view, and since the first reflective film and the second reflective film are placed apart from each other in the thickness direction, it is possible to emit incident light L12 with high incident angle with respect to the first reflective film 22 side surface of the reflective structure 20, that is, the surface 13A of the side wherein the first layer (not shown in the figure) of the reflective structure 20 (second layer) is placed, from the side surface of the convex portion 26 and the opening 25 of the second reflective film 24. Thereby, a part of the light emitted from the LED element, and then, emitted from the second layer side surface of the diffusion member may be emitted from a position away from the LED element in in-plane direction, rather than directly above the LED element. Therefore, in-plane uniformity of luminance may be improved. Also, in the present aspect, since the convex portion is provided, a self-alignment of the openings of the first reflective film and the second reflective film is possible, and the production cost may be reduced.

Incidentally, the materials of the first reflective film and the second reflective film; the pitch of the opening of the first reflective film and the second reflective film; the sizes of the opening of the first reflective film and the second reflective film; the shape of the opening of the first reflective film and the second reflective film; the thickness of the first reflective film and the second reflective film; and the method for forming the first reflective film and the second reflective film, may be similar to the first aspect described above.

Also, the transparent substrate may be similar to the first aspect described above.

The convex portion in the reflective structure in the present aspect is a member configured to place the first reflective film and the second reflective film apart from each other in the thickness direction. The convex portion has a light transmissivity. As the light transmissivity of the convex portion, the total light transmittance of the convex portion is preferably, for example, 80% or more, and among them, preferably 90% or more. Incidentally, the total light transmittance of the convex portion may be measured, for example, by a method according to JIS K7361-1: 1997.

As a material constituting the convex portion, any material wherein a convex portion in a pattern form may be formed, and having the total light transmittance described above may be used, and examples thereof may include a thermosetting resin and an electron beam curable resin.

As shown in FIG. 8B for example, the height of the convex portion is preferably a height such that it is possible to emit incident light L12 with high incident angle with respect to the first reflective film 22 side surface of the reflective structure 20, that is, the surface 13A of the side wherein the first layer (not shown in the figure) of the reflective structure 20 (second layer) is placed, from the side surface of the convex portion 26 and the opening 25 of the second reflective film 24; and it is appropriately set according to, for example, the pitch and size of the opening of the first reflective film and the second reflective film, and the thickness of the first reflective film and the second reflective film. Specifically, the height of the convex portion may be 0.05 mm or more and 2 mm or less, and among the above, preferably 0.1 mm or more and 0.5 mm or less.

Figure 9A:
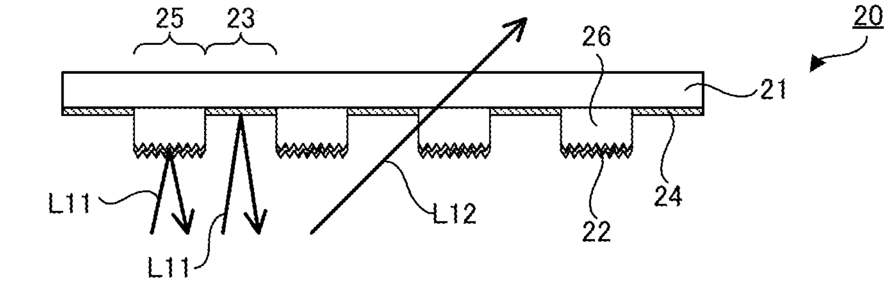
FIGS. 9A and 9B are schematic cross-sectional views illustrating another example of the second aspect of the reflective structure of the second diffusion member.

The pitch, the size, and the plan view shape of the convex portion may be similar to the pitch, the size, and the shape of the opening of the second reflective film. The surface of the convex portion may be a smooth surface as shown in FIG. 8B for example, and may be a rough surface as shown in FIG. 9A. When the surface of the convex portion is a rough surface, it is possible to impart light diffusivity to the convex portion.

Figure 9B:
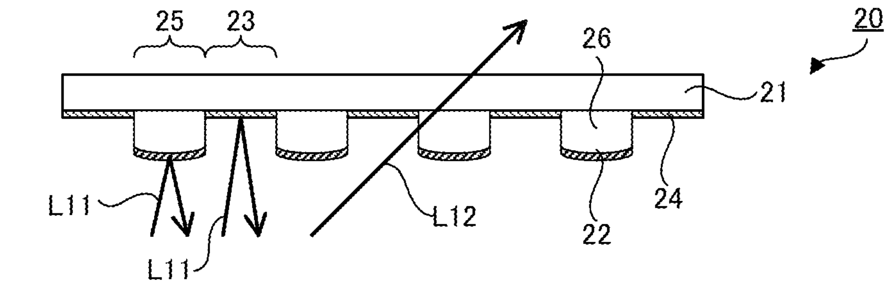

Also, the shape of the surface of the convex portion may be, for example, a flat surface as shown in FIG. 8B, and may be a curved surface as shown in FIG. 9B. When the surface of the convex portion is curved, it is possible to impart light diffusivity to the convex portion.

The method for forming the convex portion is not particularly limited as long as it is a method capable of forming a convex portion in a pattern form, and examples thereof may include a printing method, and a resin shaping by a mold.

(3) Reflection Type Diffractive Grating

When the second layer is a reflection type diffractive grating, the reflection type diffractive grating is not particularly limited as long as it has the incident angle dependency in reflectance and transmittance described above.

The pitch, for example, of the reflection type diffractive grating may be appropriately adjusted so as to obtain the incident angle dependency in reflectance and transmittance described above. Specifically, when the wavelength of the light output by the LED element is a single color such as red, green, and blue, the light from the LED element may be effectively reflected by setting the pitch according to the respective wavelengths.

As the material constituting the reflection type diffractive grating, any material capable of obtaining a reflection type diffractive grating having the incident angle dependency in reflectance and transmittance described above, may be used, and a material commonly used for a reflection type diffractive grating may be employed. A method for forming a reflection type diffractive grating may be similar to a method for forming a common reflection type diffractive grating.

3.3 Third Diffusion Member

Examples of the third diffusion member may include a resin plate including a light transmitting resin such as polystyrene (PS) and polycarbonate, wherein a number of void voids are present inside thereof, or convexoconcave is included on the surface, and those commonly used in the display device field generally may be used.

4. Wavelength Conversion Member

In the surface-emitting device in the present disclosure, for example, a wavelength conversion member may be placed on opposite surface side to the light-emitting diode substrate side of the diffusion member, and a wavelength conversion member may be placed on the light-emitting diode substrate side of the diffusion member.

The wavelength conversion member is a member that includes a fluorescent substance that absorbs light emitted from the light-emitting diode element and emits excitation light. The wavelength conversion member has a function of generating white light by being combined with a light-emitting diode substrate.

The wavelength conversion member usually includes at least a wavelength conversion layer including a fluorescent substance and a resin. The wavelength conversion member may be, for example, a wavelength conversion layer alone, and may be a stacked body including a wavelength conversion layer on one surface side of a transparent substrate. Among them, a wavelength conversion layer alone is preferable from the viewpoint of the reduction of the thickness. More preferably, a sheet shaped wavelength conversion member is used.

The fluorescent substance may be appropriately selected according to the emission color from the light-emitting diode element; and examples thereof may include a blue fluorescent substance, a green fluorescent substance, a red fluorescent substance, and a yellow fluorescent substance. For example, when the LED element is a blue LED element, a green fluorescent substance and a red fluorescent substance may be used as the fluorescent substance, and a yellow fluorescent substance may be used. Also, for example, when the LED element is an ultraviolet LED element, a red fluorescent substance, a green fluorescent substance, and a blue fluorescent substance may be used as the fluorescent substance.

For example, a fluorescent substance used for a wavelength conversion member of a LED backlight may be employed as the fluorescent substance. The quantum dots may also be used as the fluorescent substance. The content of the fluorescent substance in the wavelength conversion member layer is not particularly limited as long as it may generate a desired white light, and may be similar to the content of the fluorescent substance in a common wavelength conversion member in an LED backlight.

Further, the resin included in the wavelength conversion member is not particularly limited as long as the fluorescent substance may be dispersed. The resin may be similar to a resin used for a common wavelength conversion member in a LED backlight, and examples thereof may include a thermosetting resin such as a silicone based resin and an epoxy based resin.

The thickness of the wavelength conversion member is not particularly limited as long as the thickness may generate a desired white light when used for a surface-emitting device, and may be, for example, 10 μm or more and 1000 μm or less.

5. Other Optical Members

In the surface-emitting device in the present disclosure, for example, an optical member may further be placed on opposite surface side to the light-emitting diode substrate side surface of the diffusion member. Examples of the optical member may include a prism sheet, and a reflection type polarizing sheet.

(1) Prism Sheet

The prism sheet in the present disclosure has a function of collecting the incident light and intensively improving the luminance in the front direction. The prism sheet, for example, is one wherein a prism pattern including an acrylic resin, for example, is placed on one surface side of a transparent resin substrate. As the prism sheet, for example, a BEF series luminance improving film from 3M Corporation may be used.

(2) Reflection Type Polarizing Sheet

The reflection type polarizing sheet in the present disclosure has a function of transmitting only the first linearly polarized light component (such as P-polarized light) and reflecting, without absorbing, the second linearly polarized light component (such as S-polarized light) orthogonal to the first linearly polarized light component. The second linearly polarized light component reflected by the reflection type polarizing sheet is reflected again, and enters again into the reflection type polarizing sheet in a condition wherein the polarization is resolved (a condition including both the first linearly polarized light component and the second linearly polarized light component). Therefore, the reflection type polarizing sheet transmits the first linearly polarized light component among the light incident again, and the second linearly polarized light component orthogonal to the first linearly polarized light component is reflected again. Thereafter, by repeating the above process, approximately 70% to 80% of the light emitted from the second layer is emitted as the light of the first linearly polarized light component. Therefore, when the surface-emitting device in the present disclosure is used in a display device, all the light emitted from the surface-emitting device is usable for imaging in a display panel, by matching the polarization direction of the first linearly polarized light component (transmission axis component) of the reflection type polarizing sheet and the transmission axis direction of the polarizing plate of the display panel. Thus, even when the input light energy from the light-emitting diode element is the same, a higher luminance image may be formed as compared with the case where the reflection type polarizing sheet is not placed.

Examples of the reflection type polarizing sheet may include a luminance improving film DBEF series from 3M Corporation. Further, as the reflection type polarizing sheet, for example, a high luminance polarizing sheet WRPS from Shinwha Intertek Corporation, and a wire grid polarizer may be used.

6. Application

The application of the surface-emitting device in the present disclosure is not particularly limited, and may be suitably used for a display device. Also, it may be used for, for example, an illuminating device.

7. Method for Producing

A method for producing a surface-emitting device in the present disclosure is not particularly limited. Examples thereof may include a method wherein a stacked body including the sealing member sheet formed by the method described above stacked on the light-emitting diode substrate placed so that the light-emitting diode element is on the sealing member sheet side, is prepared, and the stacked body is heat compression bonded. A heat compression bonding method is not particularly limited as long as it is a method capable of heat compression bonding these layers, and for example, a vacuum lamination method, a vacuum packing method, and a heat-laminating method may be used.

When the sealing member in the present disclosure is a multi-layer member, a method wherein a sealing member sheet is formed and stacked, as a multi-layer film, on the light-emitting diode substrate by coextruding, and heat compression bonded, is preferable. Also, when the skin layer is a pressure-sensitive adhesive layer, the following method may be used; on the light-emitting element side of the light-emitting diode substrate, a pressure-sensitive adhesive film and a sealing film constituting the core layer which is a sealing layer, are sequentially adhered in this order.

By placing the diffusion member on the sealing member side of the compression bonded stacked body described above, a surface-emitting device may be produced.

B. Display Device

The present disclosure provides a display device comprising a display panel; and the surface-emitting device described above placed on a rear surface of the display panel.

Figure 10:
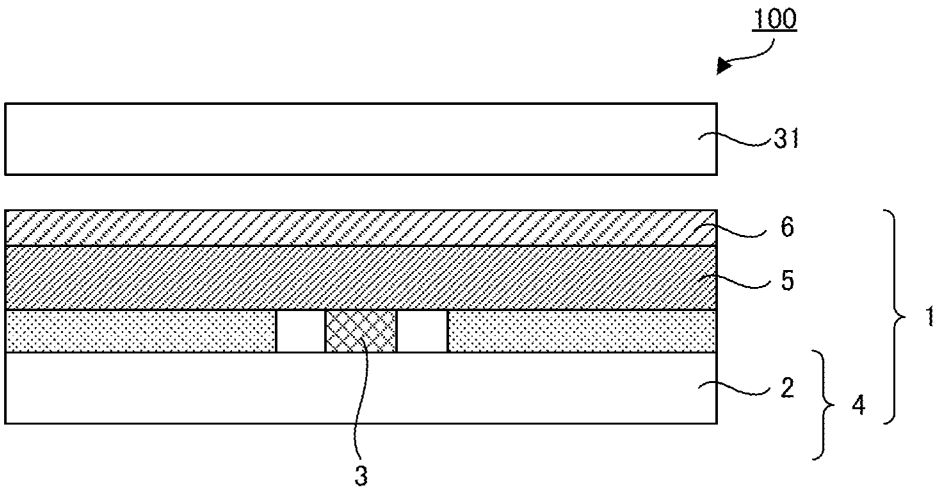
FIG. 10 is a schematic view illustrating an example of a display device in the present disclosure.

FIG. 10 is a schematic view illustrating an example of a display device in the present disclosure. As shown in FIG. 10, a display device 100 comprises a display panel 31; and the surface-emitting device 1 in the present disclosure placed on a rear surface of the display panel 31.

According to the present disclosure, by including the surface-emitting device described above, the in-plane uniformity of luminance may be improved while reducing the thickness. Therefore, a high quality display device may be obtained.

1. Surface-Emitting Device

The surface-emitting device in the present disclosure is similar to those described in the section "A. Surface-emitting device" above.

2. Display Panel

The display panel in the present disclosure is not particularly limited, and examples thereof may include a liquid crystal panel.

C. Sealing Member Sheet

The present disclosure provides a sealing member sheet for a surface-emitting device used for a surface-emitting device, wherein the sealing member sheet for a surface-emitting device includes a thermoplastic resin, and a haze value measured according to the following test method is 4% or more.

(Test Method)

The sealing member sheet for a surface-emitting device is sandwiched between two ethylene tetrafluoroethylene copolymer films with a thickness of 100 μm; the sealing member sheet for a surface-emitting device is heated and pressurized at heating temperature of 150° C., vacuuming time of 5 minutes, a pressure of 100 kPa, and pressurizing time of 7 minutes; cooled to 25° C.; the two ethylene tetrafluoroethylene copolymer films were peeled off from the sealing member sheet for a surface-emitting device; and a haze of only the sealing member sheet for a surface-emitting device is measured.

The sealing member sheet in the present disclosure has a predetermined haze value after a predetermined heating pressurizing and cooling conditions. The haze value is similar to the value described in the section "A. Surface-emitting device, 1. Sealing member, (1) Haze value" above. Also, the heating pressurizing and cooling conditions are as described above.

Also, the degree of vacuum is preferably 200 Pa or less, more preferably 150 Pa or more, and particularly preferably 133 Pa or more. Also, the thickness of the sealing member sheet in the present disclosure is preferably, for example, thicker than the thickness of the light-emitting diode element sealed by the sealing member sheet, after the test method described above. Specifically, it may be similar to the value described in the section "A. Surface-emitting device, 1. Sealing member, (2) Thickness" above. Also, the sealing member sheet in the present disclosure may be formed by forming a sealing material composition including the thermoplastic resin and other components described in the section "A. Surface-emitting device, 1. Sealing member, (3) Material of sealing member" above, into a sheet shape by mold processing by a conventionally known method. Further, the structure described in the section "A. Surface-emitting device, 1. Sealing member, (4) Structure of sealing member" and "(5) Preferable sealing member" above may be employed.

D Method for Producing a Surface-Emitting Device

The present disclosure provides a method for producing a surface-emitting device, the surface-emitting device comprising: a light-emitting diode substrate including a supporting substrate, and a light-emitting diode element placed on one surface side of the supporting substrate, a sealing member placed on a light-emitting diode element side surface of the light-emitting diode substrate, and configured to seal the light-emitting diode element, and a diffusion member placed on the sealing member, on an opposite surface side to a light-emitting diode substrate side, wherein the method comprises a step of stacking the sealing member sheet for a surface-emitting device described above on a light-emitting diode element side of the light-emitting diode substrate, and heat compression bonding by a vacuum lamination. Since the sealing member sheet may be similar to those described in the section "C. Sealing member sheet" above, description thereof is omitted herein. The vacuum lamination conditions and the cooling conditions thereafter are not particularly limited as long as the sealing member sheet for a surface-emitting device and the light-emitting diode substrate may be heat compression bonded, and the haze value described above may be obtained. For example, the conditions described in Examples may be employed.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

The present disclosure is hereinafter explained in further details with reference to Examples and Comparative Examples.

Example 1

Figure 11:
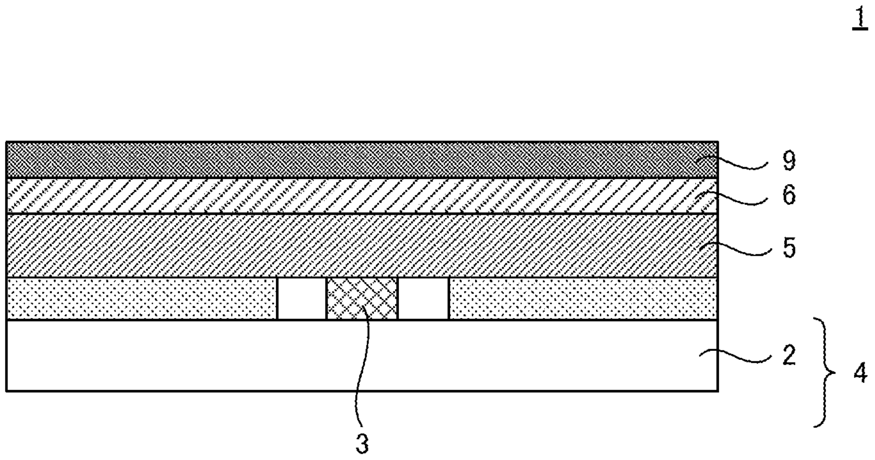
FIG. 11 is a schematic cross-sectional view illustrating a surface-emitting device produced in Examples.
Figure 12A:
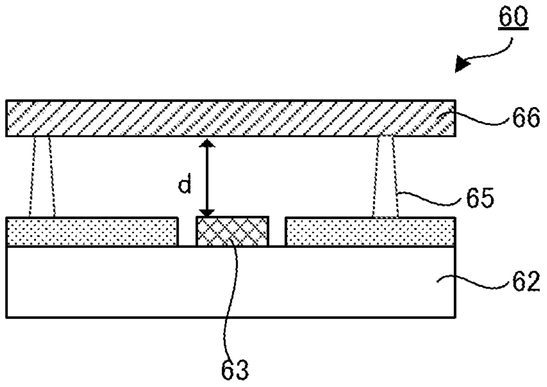
Figure 12A:
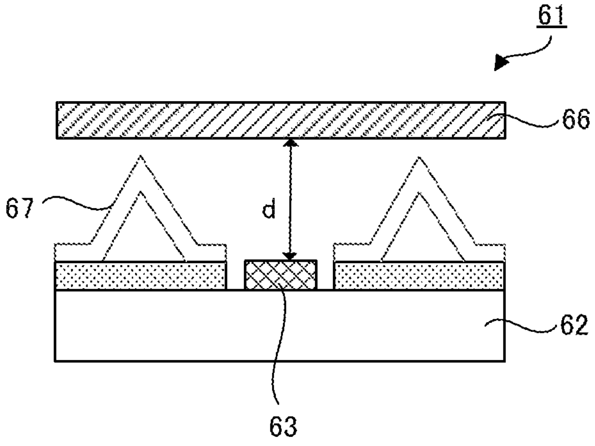
Figure 12A:
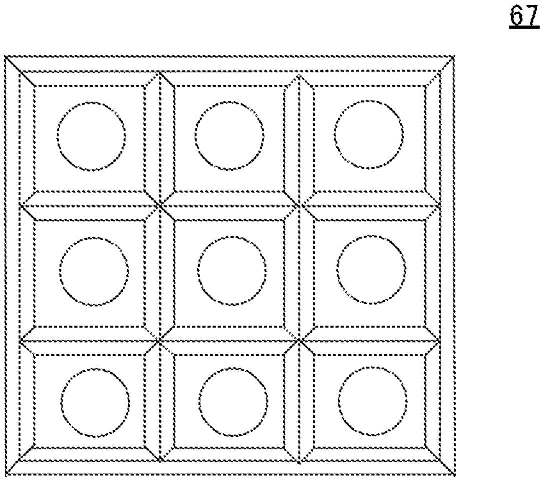

As shown in FIG. 11, a surface-emitting device 1 comprising a light-emitting diode substrate 4 including a supporting substrate 2, and a light-emitting diode element 3; a sealing member A (thickness: 450 μm) 5; a diffusion member A6; and a wavelength conversion member 9, was produced. The haze value, the layer structure, the density of the base resin, and the transmittance at wavelength of 450 nm of the sealing member A are shown in Table 1. The evaluation result of the luminance unevenness evaluated by the following method is shown in Table 2.

The surface-emitting device was produced as follows. Incidentally, the members used herein were as follows.

- Light-emitting diode substrate LED chips B0815ACQ0 (chip size of 0.2 mm×0.4 mm, chip thickness of 0.1 mm, from GeneLite Inc.) were tetragonally arranged on a supporting substrate (reflectance of 95%) with a pitch of 6 mm.
- Diffusion member A (diffusion plate) 55K3 (from Entire Technology Co., Ltd.)
- Wavelength conversion member (QD) QF-6000 (from Showa Denko Materials Pte. Ltd.)

(Composition for Sealing Member A)

To 100 parts by mass of the following base resin 1, 5 parts by mass of additive resin 1 (weather resistant agent masterbatch), and 20 parts by mass of additive resin 2 (silane modified polyethylene resin) were mixed in the ratio to obtain a composition for sealing member A.

Base Resin 1

Metallocene based linear low-density polyethylene based resin (M-LLDPE) with density of 0.901 g/cm$^3$, melting point of 93° C., MFR at 190° C. of 2.0 g/10 min.

Additive Resin 1 (Weather Resistant Agent Masterbatch)

A masterbatch wherein 0.6 parts by mass of KEMISTAB62 (HALS), 3.5 parts by mass of KEMISORB12 (UV absorber), and 0.6 parts by mass of KEMISORB79 (UV absorber) were added to 100 parts by mass of low-density polyethylene based resin with density of 0.919 g/cm$^3$, and MFR at 190° C. of 3.5 g/10 min.

Additive Resin 2 (Silane Modified Polyethylene Based Resin)

A silane modified polyethylene based resin obtained by mixing 5 parts by mass of vinyltrimethoxysilane, and 0.15 parts by mass of dicumyl peroxide as a radical generator (reaction catalyst) with 95 parts by mass of metallocene based linear low-density polyethylene based resin with density of 0.898 g/cm$^3$, and MFR of 3.5 g/10 min, and fusing and kneading at 200° C. The density of this additive resin 2 was 0.901 g/cm$^3$, and MFR was 1.0 g/10 min.

A sealing member sheet A was obtained by forming the composition for sealing member A into a single-layer film with an extruder.

The sealing member sheet A, and the light-emitting diode substrate placed so that the LED element was on the sealing member sheet side were stacked, and then, a lamination of the light-emitting diode substrate and the sealing member sheet was carried out under the conditions similar to the following conditions, using a vacuum laminator. Specifically, the lamination of the following structure was carried out under the following vacuum lamination conditions; glass (thickness of 3 mmt)/ETFE (ethylenetetrafluoroethylene copolymer film) film (thickness of 100 μm)/light-emitting diode substrate/sealing member sheet/ETFE film (thickness of 100 μm)/glass (thickness of 3 mmt). The glasses were used in order to obtain appropriate flat surfaces.

(Vacuum Lamination Conditions)

(a) Vacuum suction: 5.0 minutes (b) Pressure application: (0 kPa to 100 kPa): 5 seconds (c) Pressure maintaining: (100 kPa): 7 minutes (d) Temperature: 150° C.

The cooling conditions of the vacuum lamination (Example 1 and following Examples 2 to 4 and Comparative Examples 5 and 6) were as follows. That is, on a shelf provided with an iron plate with thickness of 2 mm, the laminated product of the structure described above was naturally cooled for approximately 30 minutes from 150° C. to 25° C. After cooling, a diffusion member and a wavelength conversion member were placed on the sealing member side of the laminated product to produce a surface-emitting device.

Incidentally, the thickness of the sealing member and the optical properties shown in Table 1 were values obtained by sandwiching the sealing member sheet between ETFE films (thickness of 100 μm), heat treating by a vacuum lamination, and measuring the sample for a sealing member after cooling. The measurement of the optical properties were carried out by peeling the ETFE films so as to measure only the sample for sealing member. The vacuum lamination conditions and the cooling conditions were similar to those when producing the surface-emitting device.

Example 2

The luminance unevenness was evaluated in the same manner as in Example 1, except that, instead of the diffusion member A, the following diffusion member B was used. The results are shown in Table 2.

Diffusion Member B

A second diffusion member including a prism structure wherein a prism surface was formed on the light-emitting diode element side, as a first layer, and a dielectric multilayer film as a second layer.

Examples 3 and 4

Instead of the sealing member A in Examples 1 and 2, a surface-emitting device including the sealing member B shown in Table 1 (thickness of 450 μm) was produced, and the luminance unevenness was evaluated. The haze value, the layer structure, the density of the base resin, and the transmittance at wavelength of 450 nm of the sealing member B are shown in Table 2. The surface-emitting device was produced as follows.

Resin compositions for forming each layer of a skin layer (first outer layer), a core layer (inner layer), and a skin layer (second outer layer) were prepared using the resin components and additives shown below. Used resin components and additives are shown below.

Base Resin 1:

Metallocene based linear low-density polyethylene with density of 0.880 g/cm$^3$, melting point of 60° C., and MFR of 3.5 g/10 min (190° C.).

Base Resin 2:

Low-density polyethylene with density of 0.919 g/cm$^3$, melting point of 106° C., and MFR of 3.5 g/10 min (190° C.).

Weather Resistant Agent Masterbatch (MB):

A masterbatch was obtained by mixing 3.8 parts by mass of a benzophenol based ultraviolet absorber, 5 parts by mass of a hindered amine based light stabilizer, and 0.5 parts by mass of a phosphorous based heat stabilizer, with 100 parts by mass of pulverized powder of Ziegler linear low-density polyethylene with density of 0.880 g/cm$^3$, melting, processing, and pelletizing.

Silane Modified Resin:

A silane modified polyethylene based resin obtained by mixing 5 parts by mass of vinyltrimethoxysilane, and 0.15 parts by mass of dicumyl peroxide as a radical generator (reaction catalyst) with 95 parts by mass of metallocene based linear low-density polyethylene based resin with density of 0.898 g/cm$^3$, and MFR of 3.5 g/10 min, and fusing and kneading at 200° C. The density of this silane modified resin was 0.901 g/cm$^3$, and MFR was 1.0 g/10 min.

(Composition for Sealing Member B Skin Layer)

To 90 parts by mass of the metallocene based linear low-density polyethylene (base resin 1), 2 parts by mass of the "weather resistant agent masterbatch", and 13 parts by mass of "silane modified polyethylene resin" were mixed in the ratio.

(Composition for Sealing Member B Core Layer)

To 15 parts by mass of the metallocene based linear low-density polyethylene (base resin 1), 85 parts by mass of the low-density polyethylene (base resin 2), 2 parts by mass of "weather resistant agent masterbatch", and 1 part by mass of the "silane modified polyethylene resin" were mixed in the ratio.

A sealing member sheet B was obtained by forming a multi-layer film with the thickness ratio of skin layer:core layer:skin layer being 1:6:1 by coextrusion of the compositions of respective layers. A surface-emitting device was produced in the same manner as in Example 1 except that the sealing member sheet B was used.

Examples 5 and 6

Instead of the sealing member A in Examples 1 and 2, a surface-emitting device including the sealing member D shown in Table 1 (thickness of 450 μm) was produced, and the luminance unevenness was evaluated. The haze value, the layer structure, the density of the base resin, and the transmittance at wavelength of 450 nm of the sealing member D are shown in Table 2. The surface-emitting device was produced as follows.

A surface-emitting device including the sealing member D was produced in the same manner as in Example 2 except that the cooling conditions of the vacuum lamination were as follows.

The laminated product with the structure was cooled by taking the glasses (thickness of 3 mmt) off from the laminated product, charging the laminated product directly into a cooling tray of 25 cm length×35 cm width×10 cm depth filled with 5 L of cooling water at 25° C., and taking it out after 3 minutes.

Comparative Examples 1 and 2

The luminance unevenness was evaluated in the same manner as in Examples 1 and 2, except that, instead of the sealing member A, a pin was provided between the diffusion member and the light-emitting diode substrate. The results are shown in Table 2. In doing so, the distance between the light-emitting diode element and the diffusion member was 500 μm.

Comparative Examples 3 and 4

The luminance unevenness was evaluated in the same manner as in Examples 1 and 2, except that, instead of the sealing member A, a Si cured product (thickness of 450 μm) using a liquid silicone composition of a high-transparent potting type was provided. The results are shown in Table 2.

Comparative Examples 5 and 6

Instead of the sealing member A, a surface-emitting device including the sealing member C (thickness of 450 μm) shown in Table 1, was produced, and the luminance unevenness was evaluated in the same manner as in Examples 1 and 2. The results are shown in Table 2. The haze value, the layer structure, the density of the base resin, and the transmittance at wavelength of 450 nm of the sealing member C are shown in Table 2. The surface-emitting device was produced as follows.

Base Resin:

Metallocene based linear low-density polyethylene (M-LLDPE) with density of 0.880 g/cm$^3$, melting point of 60° C., and MFR of 3.5 g/10 min (190° C.).

Weather Resistant Agent Masterbatch (MB):

A masterbatch was obtained by mixing 3.8 parts by mass of a benzophenol based ultraviolet absorber, 5 parts by mass of a hindered amine based light stabilizer, and 0.5 parts by mass of a phosphorous based heat stabilizer, with 100 parts by mass of pulverized powder of Ziegler linear low-density polyethylene with density of 0.880 g/cm$^3$, melting, processing, and pelletizing.

Cross-Linking Agent Masterbatch (MB):

Cross-linking agent masterbatch: a masterbatch was obtained by impregnating 0.5 parts by mass of 2,5-dimethyl-2,5-di(t-butylperoxy)hexane, as a cross-linking agent, into 100 parts by mass of M-LLDPE pellet with melting point of 60° C., density of 0.880 g/cm$^3$, and MFR at 190° C. of 3.1 g/10 min.

Silane Modified Resin:

A silane modified polyethylene based resin obtained by mixing 5 parts by mass of vinyltrimethoxysilane, and 0.15 parts by mass of dicumyl peroxide as a radical generator (reaction catalyst) with 95 parts by mass of metallocene based linear low-density polyethylene based resin with density of 0.880 g/cm$^3$, and MFR of 3.5 g/10 min, and fusing and kneading at 200° C. The density of this silane modified resin was 0.883 g/cm$^3$, and MFR was 1.0 g/10 min.

(Composition for Sealing Member C Skin Layer)

To 90 parts by mass of the "metallocene based linear low-density polyethylene (M-LLDPE), 2 parts by mass of the "weather resistant agent masterbatch", 13 parts by mass of "silane modified polyethylene resin", and 5 parts by mass of "cross-linking agent masterbatch" were mixed in the ratio.

(Composition for Sealing Member C Core Layer)

To 94 parts by mass of the "metallocene based linear low-density polyethylene (M-LLDPE), 2 parts by mass of "weather resistant agent masterbatch", 1 part by mass of the "silane modified polyethylene resin", and 8 parts by mass of "cross-linking agent masterbatch" were mixed in the ratio.

A sealing member sheet C was obtained by forming a multi-layer film with the thickness ratio of skin layer:core layer:skin layer being 1:6:1 by coextrusion of the compositions of respective layers. A surface-emitting device was produced in the same manner as in Examples 1 and 2 except that the sealing member sheet C was used.

TABLE 1

| | Haze value [%] | Layer structure | Density [g/cm³] | Transmittance [%] |
|---|---|---|---|---|
| Sealing member A | 15 | Single layer | 0.901 | 85 |
| Sealing member B | 15 | 2 types 3 layers | Skin layer: 0.880 Core layer: 0.919, 0.880 | 83 |
| Sealing member C | 1.9 | 2 types 3 layers | Skin layer: 0.880 Core layer: 0.880 | 90 |
| Sealing member D | 4.3 | 2 types 3 layers | Skin layer: 0.880 Core layer: 0.919, 0.880 | 88.7 |

[Luminance Unevenness Evaluation Method]

The luminance of the obtained surface-emitting device, at the time of LED emitting, was measured using a two-dimensional color luminance meter CA2000 to evaluate the luminance unevenness. The luminance unevenness was evaluated as follows using uniformity value as indexes.

[Evaluation Criteria]

Uniformity=minimum value of front luminance/maximum value of front luminance

A: uniformity >0.9

B: uniformity 0.8 to 0.9

C: uniformity <0.8

TABLE 2

| | Supporting member | Diffusion member | Luminance unevenness evaluation |
|---|---|---|---|
| Example 1 | Sealing member A | Diffusion member A | A |
| Example 2 | Sealing member A | Diffusion member B | A |
| Example 3 | Sealing member B | Diffusion member A | A |
| Example 4 | Sealing member B | Diffusion member B | A |
| Example 5 | Sealing member D | Diffusion member A | A |
| Example 6 | Sealing member D | Diffusion member B | A |
| Comp. Ex. 1 | Pin | Diffusion member A | B |
| Comp. Ex. 2 | Pin | Diffusion member B | B |
| Comp. Ex. 3 | Liquid Si | Diffusion member A | B |
| Comp. Ex. 4 | Liquid Si | Diffusion member B | B |
| Comp. Ex. 5 | Sealing member C | Diffusion member A | C |
| Comp. Ex. 6 | Sealing member C | Diffusion member B | C |

The surface-emitting device in the present disclosure (Examples 1 to 6) was able to suppress the luminance unevenness, while in Comparative Examples 1 and 2 wherein a pin was provided; Comparative Examples 3 and 4 wherein a cured product of liquid Si was used; and Comparative Examples 5 and 6 wherein a sealing member C with low haze value was used, instead of sealing member A, the luminance unevenness could not be suppressed.

REFERENCE SIGNS LIST

1, 10: surface-emitting device

2: supporting substrate

3: light-emitting diode element

4: light-emitting diode substrate

5: sealing member

6: diffusion member

100: display device

The invention claimed is:

1. A sealing member sheet for a surface-emitting device, wherein the sealing member sheet for the surface-emitting device includes a thermoplastic resin, and a haze value measured according to the following test method is 4% or more, (Test method)

the sealing member sheet for the surface-emitting device is sandwiched between two ethylene tetrafluoroethylene copolymer films with a thickness of 100 μm; the sealing member sheet for the surface-emitting device is heated and pressurized at heating temperature of 150° C., vacuuming time of 5 minutes, a pressure of 100 kPa, and pressurizing time of 7 minutes; cooled to 25° C.; the two ethylene tetrafluoroethylene copolymer films were peeled off from the sealing member sheet for the surface-emitting device; and a haze of only the sealing member sheet for the surface-emitting device is measured.

2. The sealing member sheet for the surface-emitting device according to claim 1, wherein a thickness of the sealing member sheet for the surface-emitting device after the test method is 50 μm or more and 800 μm or less.

3. The sealing member sheet for the surface-emitting device according to claim 1, wherein the sealing member sheet for the surface-emitting device includes a polyethylene based resin with a density of 0.870 g/cm³ or more and 0.930 g/cm³ or less as a base resin.

4. The sealing member sheet for the surface-emitting device according to claim 1, wherein the sealing member sheet for the surface-emitting device includes a core layer, and a skin layer placed on at least one surface side of the core layer.

5. The sealing member sheet for the surface-emitting device according to claim 4, wherein melting points of thermoplastic resins included in the core layer and the skin layer as base resins are different from each other.

6. The sealing member sheet for the surface-emitting device according to claim 4, wherein the thermoplastic resin is a base resin of the core layer and has a melting point of 90° C. or more and 120° C. or less.

7. The sealing member sheet for the surface-emitting device according to claim 4, wherein the core layer includes a polyethylene based resin with a density of 0.900 g/cm³ or more and 0.930 g/cm³ or less as a base resin; and the skin layer includes a polyethylene based resin with a density of 0.875 g/cm³ or more and 0.910 g/cm³ or less as a base resin, and is lower than the density of the base resin for the core layer.

8. A method for producing the surface-emitting device with the sealing member sheet according to claim 1, the surface-emitting device comprising:

a light-emitting diode substrate including a supporting substrate, and a light-emitting diode element placed on one surface side of the supporting substrate;

a sealing member placed on a light-emitting diode element side surface of the light-emitting diode substrate, and configured to seal the light-emitting diode element; and a diffusion member placed on the sealing member, on an opposite surface side to a light-emitting diode substrate side, wherein the method comprises a step of stacking the sealing member sheet for the surface-emitting device on a light-emitting diode element side of the light-emitting diode substrate, and heat compression bonding by a vacuum lamination.

* * * * *